(12) United States Patent  
Zhang et al.

(10) Patent No.: US 12,307,979 B2  
(45) Date of Patent: May 20, 2025

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Huanxi Zhang, Hubei (CN); Chao Dai, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/526,033

(22) Filed: Dec. 1, 2023

(65) Prior Publication Data

US 2025/0124875 A1  Apr. 17, 2025

(30) Foreign Application Priority Data

Oct. 13, 2023 (CN) .......................... 202311342726.9

(51) Int. Cl.  
*G09G 3/3266* (2016.01)  
*G09G 3/3225* (2016.01)  
*H10K 59/131* (2023.01)

(52) U.S. Cl.  
CPC ......... *G09G 3/3266* (2013.01); *G09G 3/3225* (2013.01); *H10K 59/131* (2023.02); *G09G 2300/0408* (2013.01); *G09G 2310/0243* (2013.01); *G09G 2310/0291* (2013.01)

(58) Field of Classification Search  
CPC ... G09G 3/32–3291; G09G 2300/0408; H10K 59/131  
See application file for complete search history.

(56) References Cited

U.S. PATENT DOCUMENTS

2018/0374415 A1* 12/2018 Morita ............... H10K 59/1213  
2024/0127758 A1*  4/2024 Ono ..................... G09G 3/3266

\* cited by examiner

*Primary Examiner* — Gene W Lee  
(74) *Attorney, Agent, or Firm* — PV IP PC; Wei Te Chung

(57) ABSTRACT

The present application discloses a display panel including a quantity N of driver units that are cascaded. The quantity N of the driver units are arranged along a first direction. Each of the driver units includes a first output module, a signal generation module, and a second output module disposed along a second direction. The first output module is configured to output a first gate electrode driving signal. The second output module is configured to output a second gate electrode driving signal. The first gate electrode driving signal is different from the second gate electrode driving signal. The first output module includes a first buffer unit and a second buffer unit stacked on each other along a third direction. The present application stacks two buffer units in the first output module, which reduce a width of a frame occupied by the first output module while guaranteeing performance of transistors.

18 Claims, 20 Drawing Sheets

DISPLAY PANEL

CROSS REFERENCE TO RELATED APPLICATIONS

This application claims the priority to Chinese Patent Application No. 202311342726.9, filed on Oct. 13, 2023. The entire disclosures of the above application are incorporated herein by reference.

FIELD OF INVENTION

The present application relates to a field of display technologies, especially to a display panel.

BACKGROUND OF INVENTION

An organic light-emitting diode (OLED) display technology is a new display technology, attracting people's attention gradually due to its unique advantages such as low power consumption, high saturation, fast response time, and wide viewing angles. It occupies a certain position in the field of display technologies for display panels.

In the related technology, the pixel driving circuit of an OLED display panel is typically an 8T2C circuit. For this pixel driving circuit, a gate electrode driver circuit (Gate On Array, GOA) based on complementary metal oxide semiconductor (CMOS) has been proposed to address the high power consumption issue of conventional gate electrode driver circuits.

As the CMOS GOA circuit needs to generate two types of signals, Nout and Pout, the gate electrode driver circuit is equipped with two corresponding buffer sections for Nout and Pout. The buffer section for outputting the gate electrode driving signal Nout has two parallelly arranged buffer units. Consequently, it requires a wider region on the product's frame to accommodate the gate electrode driver circuit, contradicting the design trend of narrow-framed products.

Therefore, there is an urgent need to provide a display panel to solve the aforementioned technical issue.

SUMMARY OF INVENTION

The present application provides a display panel to improve a technical issue of an over large frame of a conventional display apparatus.

To solve the above issue, the present application provides technical solutions as follows:

The present application provides a display panel, comprising a display portion and a gate electrode driver circuit located on a side of the display portion, wherein the gate electrode driver circuit comprises a quantity N of driver units that are cascaded, the quantity N of the driver units are arranged along a first direction, and each of the driver units comprises a signal generation module, a first output module, and a second output module disposed along a second direction;

wherein the first output module is disposed on a side of the signal generation module near the display portion, and the first output module is configured to output a first gate electrode driving signal;

wherein the second output module is disposed on a side of the signal generation module away from the display portion, the second output module is configured to output a second gate electrode driving signal, and the first gate electrode driving signal is different from the second gate electrode driving signal;

wherein the first output module comprises a first buffer unit and a second buffer unit, the first buffer unit and the second buffer unit are stacked along a third direction, the third direction is perpendicular to a plane in which the first direction and the second direction are located, the second direction is parallel to scan lines of the display panel, an included angle between the first direction and the second direction is greater than 0° and is less than or equal to 90°, and the N is a positive integer.

In an embodiment of the present application, the first buffer unit comprises a first active portion, the second buffer unit comprises a second active portion, the first active portion is a metal oxide semiconductor, the second active portion is a silicon-containing semiconductor; and the first buffer unit is disposed near a light exiting side of the display panel, and the second buffer unit is disposed away from the light exiting side of the display panel.

In an embodiment of the present application, the first buffer unit comprises a first output transistor comprising the first active portion, and the second buffer unit comprises a second output transistor comprising the second active portion; and along the second direction, a length of the first output transistor is equal to a length of the second output transistor.

In an embodiment of the present application, the first active portion comprises a first channel, and the second active portion comprises a second channel; and a length of the first active portion is equal to a length of the second active portion, and a length of the first channel is less than a length of the second channel.

In an embodiment of the present application, the first output transistor further comprises a first gate electrode disposed on the first active portion, the second output transistor further comprises a second gate electrode disposed on the second active portion;

the first gate electrode comprises a first trunk gate electrode and a plurality of first branch gate electrodes connected to the first trunk gate electrode, the second gate electrode comprises a second trunk gate electrode and a plurality of second branch gate electrodes connected to the second trunk gate electrode, the first trunk gate electrode and the second trunk gate electrode extend along the first direction, and the first branch gate electrodes and the second branch gate electrodes extend along the second direction; and an orthographic projection of the first trunk gate electrode on the second trunk gate electrode coincides with the second trunk gate electrode, orthographic projections of the first branch gate electrodes on the second branch gate electrodes are located within the second branch gate electrodes respectively.

In an embodiment of the present application, along the second direction, a length of the first branch gate electrode is equal to a length of the second branch gate electrode; and along the first direction, a width of the first branch gate electrode is less than a width of the second branch gate electrode.

In an embodiment of the present application, the first output transistor further comprises a first source electrode and a first drain electrode disposed on a side of the first gate electrode away from the first active portion, the second output transistor further comprises a second source electrode and a second drain electrode disposed between the second gate electrode and the first active portion;

the first source electrode comprises a first trunk source electrode and a plurality of first branch source electrodes connected to the first trunk source electrode, the first drain electrode comprises a plurality of first branch drain electrodes that are disposed and spaced from one another, the second source electrode comprises a plurality of second branch source electrodes that are disposed and spaced from one another, the second drain electrode comprises a plurality of second branch drain electrodes that are disposed and spaced from one another, the first trunk source electrode extends along the first direction, and the first branch source electrodes, the first branch drain electrodes, the second branch source electrodes, and the second branch drain electrodes extend along the second direction; and the first branch source electrodes and the first branch drain electrodes are disposed alternately along the first direction, the second branch source electrodes and the second branch drain electrodes along the first direction are disposed alternately, orthographic projections of the first branch source electrodes on the second branch drain electrodes respectively coincide with the second branch drain electrodes respectively, orthographic projections of the second branch source electrodes on the first branch drain electrodes respectively coincide with the first branch drain electrodes respectively, each of the first branch source electrodes is electrically connected to one of the second branch drain electrodes through at least one connection hole.

In an embodiment of the present application, the first trunk source electrode is located on a side of the first output module near the display portion; and the first branch source electrode and the first trunk source electrode include a plurality of overlap portions, and orthographic projections of the connection holes on the first source electrode are located within the overlap portions respectively.

In an embodiment of the present application, the display panel further comprises a first high potential line and a first low potential line disposed on the first source electrode or the first drain electrode, the first high potential line is electrically connected to the first branch drain electrodes, and the first low potential line is electrically connected to the second branch source electrodes.

In an embodiment of the present application, the first gate electrode driving signal is a positive pulse signal, and the second gate electrode driving signal is a negative pulse signal; and in a time interval of a frame, the first signal output terminal outputs two positive pulse signals, and the second signal output terminal outputs one negative pulse signal.

The present application also provides a display panel, comprising a display portion and a gate electrode driver circuit located on a side of the display portion, wherein the gate electrode driver circuit comprises a quantity N of driver units that are cascaded, the quantity N of the driver units are arranged along a first direction, and each of the driver units comprises a signal generation module, a first output module, and a second output module disposed along a second direction;

wherein the first output module is disposed on a side of the signal generation module near the display portion, and the first output module is configured to output a first gate electrode driving signal;

wherein the second output module is disposed on a side of the signal generation module away from the display portion, the second output module is configured to output a second gate electrode driving signal, and the first gate electrode driving signal is different from the second gate electrode driving signal;

wherein the first output module comprises a first buffer unit and a second buffer unit, the first buffer unit and the second buffer unit are stacked along a third direction, the third direction is perpendicular to a plane in which the first direction and the second direction are located, the second direction is parallel to scan lines of the display panel, and the N is a positive integer;

wherein the first buffer unit comprises a first active portion, the second buffer unit comprises a second active portion, and material of the first active portion is different from material of the second active portion.

In an embodiment of the present application, the first active portion is a metal oxide semiconductor, the second active portion is a silicon-containing semiconductor; and the first buffer unit is disposed near a light exiting side of the display panel, and the second buffer unit is disposed away from the light exiting side of the display panel.

In an embodiment of the present application, the first buffer unit comprises a first output transistor comprising the first active portion, and the second buffer unit comprises a second output transistor comprising the second active portion; and along the second direction, a length of the first output transistor is equal to a length of the second output transistor.

In an embodiment of the present application, the first active portion comprises a first channel, and the second active portion comprises a second channel; and a length of the first active portion is equal to a length of the second active portion, and a length of the first channel is less than a length of the second channel.

In an embodiment of the present application, the first output transistor further comprises a first gate electrode disposed on the first active portion, the second output transistor further comprises a second gate electrode disposed on the second active portion;

the first gate electrode comprises a first trunk gate electrode and a plurality of first branch gate electrodes connected to the first trunk gate electrode, the second gate electrode comprises a second trunk gate electrode and a plurality of second branch gate electrodes connected to the second trunk gate electrode, the first trunk gate electrode and the second trunk gate electrode extend along the first direction, and the first branch gate electrodes and the second branch gate electrodes extend along the second direction; and an orthographic projection of the first trunk gate electrode on the second trunk gate electrode coincides with the second trunk gate electrode, orthographic projections of the first branch gate electrodes on the second branch gate electrodes are located within the second branch gate electrodes respectively.

In an embodiment of the present application, along the second direction, a length of the first branch gate electrode is equal to a length of the second branch gate electrode; and along the first direction, a width of the first branch gate electrode is less than a width of the second branch gate electrode.

In an embodiment of the present application, the first output transistor further comprises a first source electrode and a first drain electrode disposed on a side of the first gate electrode away from the first active portion, the second output transistor further comprises a second source electrode and a second drain electrode disposed between the second gate electrode and the first active portion;

the first source electrode comprises a first trunk source electrode and a plurality of first branch source electrodes connected to the first trunk source electrode, the first drain electrode comprises a plurality of first branch drain electrodes that are disposed and spaced from one another, the second source electrode comprises a plurality of second branch source electrodes that are disposed and spaced from one another, the second drain electrode comprises a plurality of second branch drain electrodes that are disposed and spaced from one another, the first trunk source electrode extends along the first direction, and the first branch source electrodes, the first branch drain electrodes, the second branch source electrodes, and the second branch drain electrodes extend along the second direction; and the first branch source electrodes and the first branch drain electrodes are disposed alternately along the first direction, the second branch source electrodes and the second branch drain electrodes along the first direction are disposed alternately, orthographic projections of the first branch source electrodes on the second branch drain electrodes respectively coincide with the second branch drain electrodes respectively, orthographic projections of the second branch source electrodes on the first branch drain electrodes respectively coincide with the first branch drain electrodes respectively, each of the first branch source electrodes is electrically connected to one of the second branch drain electrodes through at least one connection hole.

In an embodiment of the present application, the first trunk source electrode is located on a side of the first output module near the display portion; and the first branch source electrode and the first trunk source electrode include a plurality of overlap portions, and orthographic projections of the connection holes on the first source electrode are located within the overlap portions respectively.

In an embodiment of the present application, the display panel further comprises a first high potential line and a first low potential line disposed on the first source electrode or the first drain electrode, the first high potential line is electrically connected to the first branch drain electrodes, and the first low potential line is electrically connected to the second branch source electrodes.

In an embodiment of the present application, the first gate electrode driving signal is a positive pulse signal, and the second gate electrode driving signal is a negative pulse signal; and in a time interval of a frame, the first signal output terminal outputs two positive pulse signals, and the second signal output terminal outputs one negative pulse signal.

Advantages: the present application discloses a display panel, comprising a quantity N of GOA units cascaded. The quantity N of the GOA units are arranged along a first direction. Each of the GOA units comprises a first output module along a second direction, a signal generation module, and a second output module. The first output module is configured to output a first gate electrode driving signal. The second output module is configured to output a second gate electrode driving signal. The first gate electrode driving signal is different from the second gate electrode driving signal. The first output module comprises a first buffer unit and a second buffer unit stacked along a third direction. The present application stacks two buffer units in the first output module, which reduce a width of a frame occupied by the first output module while guaranteeing performance of transistors in the two output modules such that the display panel achieves a narrow frame design.

DESCRIPTION OF DRAWINGS

Specific embodiments of the present invention are described in details with accompanying drawings as follows to make technical solutions and advantages of the present invention clear.

DETAILED DESCRIPTION OF PREFERRED EMBODIMENTS

Figure 1:
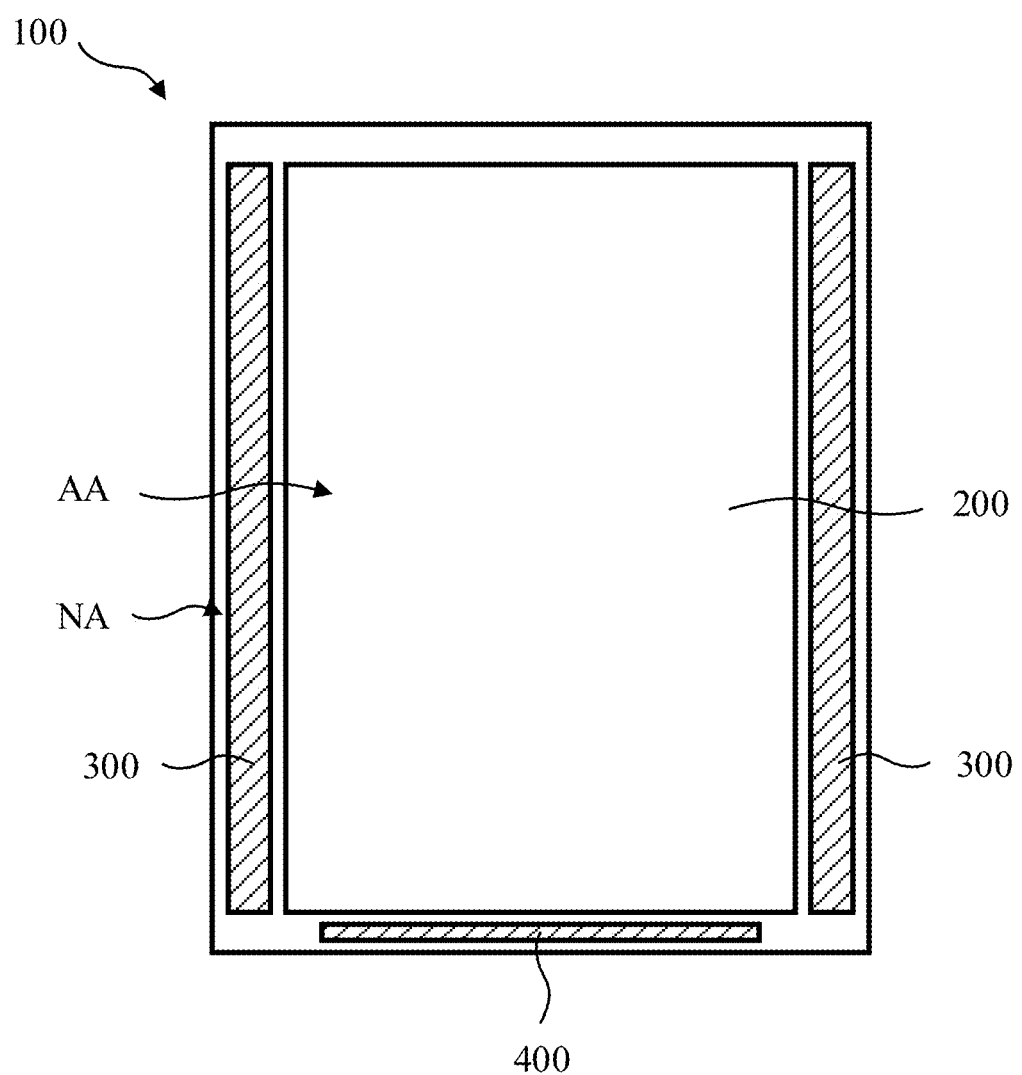
FIG. 1 is a simplified structure diagram of a display panel of the present application.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when not specified to the contrary explanation, usually refer to the upper and lower states of the device in actual use or working conditions, specifically according to the direction of the figures in the drawings. Furthermore, "inner" and "outer" refer to the outline of the device.

In a related OLED display panel, it usually employs a gate electrode driver circuit (Gate On Array, GOA) of a complementary metal oxide semiconductor (CMOS) to solve a common technical issue of a higher power consumption of a gate electrode driver circuit. However, because the CMOS GOA circuit needs to generate two types of signals Nout, Pout, the gate electrode driver circuit is disposed with two buffer portions corresponding to the signals Nout, Pout respectively. A conventional signal generation portion is usually disposed near a frame, a buffer portion is usually disposed near a display region, which results in a wider region of the frame of the product is preserved for disposing the buffer portion to contradict a design of a narrow frame of the product. The present application, based on the above technical issue, sets forth the following solution.

With reference to FIGS. 1 to 20, the present application provides a display panel 100, the display panel 100 can comprise a display portion 200 and a gate electrode driver circuit 300 located on a side of the display portion 200. The gate electrode driver circuit 300 comprises a quantity N of driver units 310 that are cascaded, and the quantity N of the driver units 310 are arranged along a first direction X.

In the present embodiment, each of the driver units 310 comprises a signal generation module 10, a first output module 20, and a second output module 30 that are disposed along a second direction Y. The first output module 20 is disposed on a side of the signal generation module 10 near the display portion 200. The first output module 20 is configured to output a first gate electrode driving signal. The second output module 30 is disposed on a side of the signal generation module 10 away from the display portion 200. The second output module 30 is configured to output a second gate electrode driving signal. The first gate electrode driving signal is different from the second gate electrode driving signal.

In the present embodiment, the first output module 20 can comprise a first buffer unit 210 and a second buffer unit 220. The first buffer unit 210 and the second buffer unit 220 are stacked on one another along a third direction Z.

Figure 2:
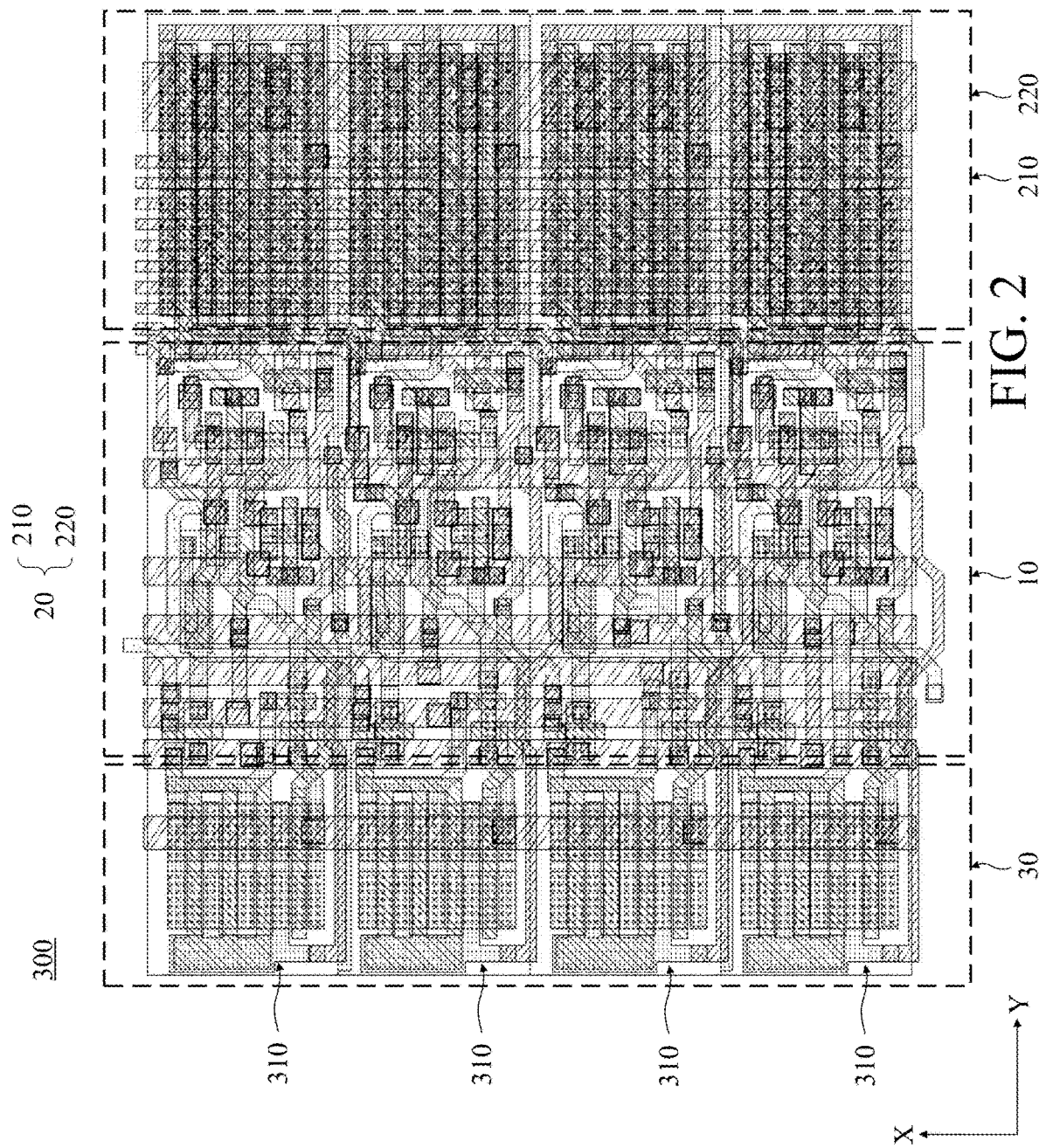
FIG. 2 is a simplified structure diagram of a gate electrode driver circuit in the display panel of the present application.

In the present embodiment, an included angle between the first direction X and the second direction Y is greater than 0° and is less than or equal to 90°. The third direction Z is perpendicular to a plane in which the first direction X and the second direction Y are located in. With reference to FIG. 2, the second direction Y is parallel to scan lines of the display panel 100. The second direction Y can be perpendicular to the first direction X.

In the present embodiment, the driver unit 310 can be a GOA unit.

The present application, by stacking two buffer units in the first output module 20, reduces a width of the frame occupied by the first output module 20 while guaranteeing performance of transistors in the two output modules such that the display panel 100 achieves a design of a narrow frame.

It should be explained that the first gate electrode driving signal is a positive pulse signal, and the second gate electrode driving signal is a negative pulse signal. Also, in a time interval of a frame, a first signal output terminal Nout outputs two positive pulse signals, and a second signal output terminal Pout outputs one negative pulse signal. Also, a pulse width of one positive pulse signal is greater than a pulse width of one negative pulse signal.

In the present embodiment, the first buffer unit 210 comprises a first output transistor T10, the first output transistor T10 comprises a first active portion T10A, the second buffer unit 220 comprises a second output transistor T9. The second output transistor T9 comprises a second active portion T9A. The first active portion T10A is a metal oxide semiconductor, the second active portion T9A is a silicon-containing semiconductor. Also, the first buffer unit 210 is disposed near a light exiting side of the display panel 100. The second buffer unit 220 is disposed away from the light exiting side of the display panel 100.

In the present embodiment, the silicon-containing semiconductor can be amorphous silicon, polycrystalline silicon, monocrystal silicon, etc.

The present application sets the first output module 20 as a combination of a low-temperature polycrystalline silicon transistor and a metal oxide transistor, uses a high mobility of the low-temperature polycrystalline silicon transistor and a low drain current of the metal oxide transistor to improve a device effect of the first output module 20. Also, the first output transistor T10 and the second output transistor T9 that are stacked reduce a width of the frame occupied by the first output module 20 such that the display panel 100 achieves a narrow frame design.

In the present embodiment, because the first output transistor T10 is a metal oxide transistor, although the metal oxide transistor has a smaller drain current, the mobility of the metal oxide transistor is comparatively low. Therefore, to improve a driving ability of the first output transistor T10, the present application increases a length of the first output transistor T10 along the second direction Y as much as possible in a limited spacer to improve the driving ability of the first output transistor T10. However, because the first output transistor T10 and the second output transistor T9 are stacked, the present application can make a length of the first output transistor T10 along the second direction Y equal to a length of the second output transistor T9 along the second direction Y, which as much as possible increases a driving ability of the second output transistor T9 to improve a load of the first output module 20.

In the display panel 100 of the present application, the second output module 30 comprises a third output transistor T6 and a fourth output transistor T7. The third output transistor T6 comprises a third active portion T6A. The fourth output transistor T7 comprises a fourth active portion T7A. The third active portion T6A and the fourth active portion T7A are silicon-containing semiconductors. The third output transistor T6 and the fourth output transistor T7 are arranged abreast along the first direction X.

In the present embodiment, because both the third output transistor T6 and the fourth output transistor T7 in the second output module 30 are silicon-containing semiconductors with a higher mobility. Therefore, a transistor of the second output module 30 needs no increase its length along the second direction Y to improve a driving ability of the third output transistor T6 and the fourth output transistor T7.

In the present embodiment, the second gate electrode driving signal outputted by the second output module 30 is a negative pulse signal, and a pulse width of the negative pulse signal is less than a pulse width of a positive pulse signal outputted by the first output module 20. Therefore, an output load of the second output module 30 is lower than an output load of the first output module 20. Therefore, a length of the first output module 20 of the present application along the second direction Y is less than a length of the second output module 30 along the second direction Y.

The technical solution of the present application will be described in combination with specific embodiments as follows.

With reference to FIG. 1, the display panel 100 comprises a display region AA and a non-display region NA disposed adjacent to the display region AA. A display portion 200 is disposed in the display region AA. Optionally, the non-display region NA surrounds the display region AA such that the display region AA is surrounded by the non-display region NA. The display region AA is a region for performing a display function in the display panel 100. A plurality of display units for implementing the display function are disposed in the display region AA. The non-display region NA can be a frame region of the display panel 100. A functional assembly for assisting the display units in the display region AA to display can be disposed in the non-display region NA.

With reference to FIG. 1, a bonding terminal 400 is disposed on a lower side of the display region AA. The bonding terminal 400 can be connected to an external circuit. The bonding terminal 400 transmits signals inputted by an external circuit to a data wiring to drive the display panel 100 to display an image. For example, the bonding terminal 400 can be bonded and connected to a chip or chip on film, and is configured to provide the display panel 100 with power and driving signals.

In the present embodiment, in the display region AA, a plurality of light emitting devices LED can be disposed in an array and a sub-pixel circuit for driving the light emitting devices LED. The sub-pixel circuit can be pixel driver circuit such as 7T1C, 7T2C, 8T2C, and the present application has no limits thereto.

In the present embodiment, the gate electrode driver circuit 300 is disposed in the non-display region NA, and the gate electrode driver circuit 300 can be disposed on two sides of the display region AA. The gate electrode driver circuit 300 can comprise a quantity N of driver units 310 that are cascaded. The quantity N of the driver units 310 can be arranged along the first direction X. A structure of the driver units 310 can be various ones. For example, a circuit structure is as shown in FIG. 3, FIG. 4 shows a timing control chart in FIG. 3.

Figure 3:
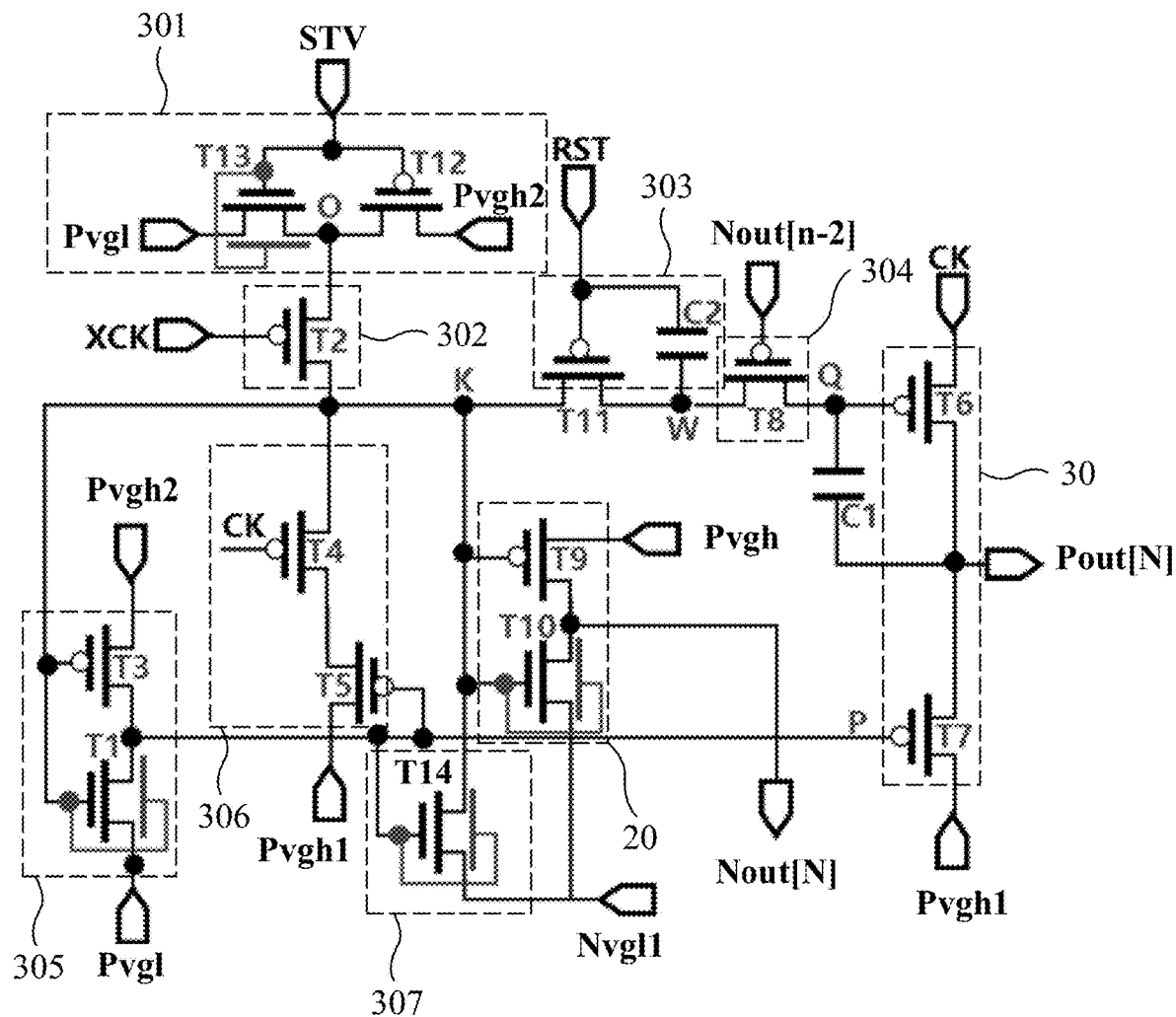
FIG. 3 is a first equivalent circuit diagram of the gate electrode driver circuit in the display panel of the present application.
Figure 4:
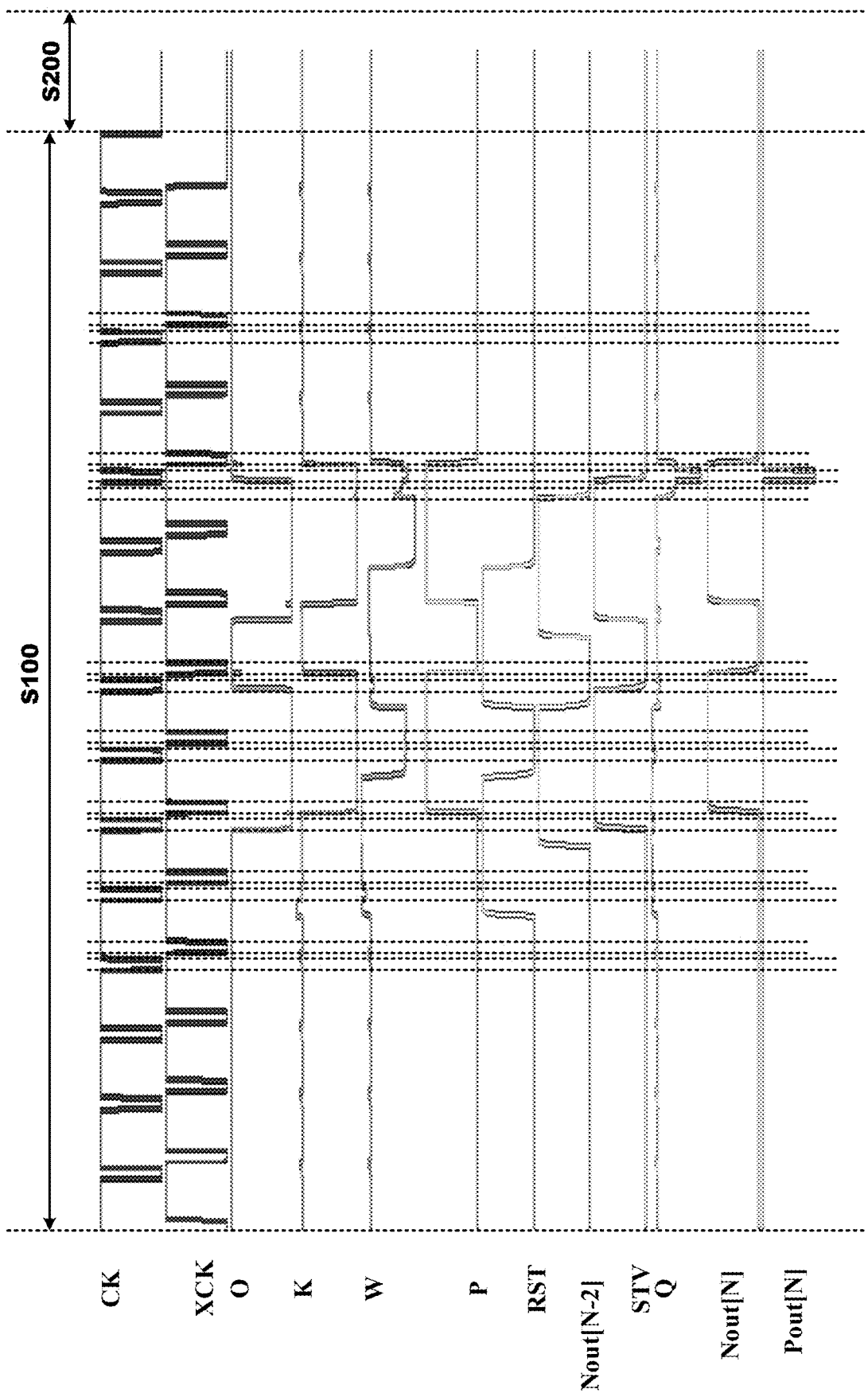
FIG. 4 is a timing control chart of the gate electrode driver circuit in the display panel of the present application.

A structure of FIG. 3 is used for example, each of the driver units 310 can comprise features as follows:

A cascade signal selection module 301 is electrically connected between an initial signal line STV and a fourth node O.

A pull-up control module 302 controls an electrical potential of a first node K according to an electrical potential of the fourth node O and an electrical potential of a second clock signal line XCK.

A first filter module 303 is electrically connected between a fifth node W and the first node K. A control end of the first filter module 303 is electrically connected to reset signal lines RST.

A second filter module 304 is electrically connected between the fifth node W and a second node Q. A control terminal of the second filter module 304 receives a first gate electrode driving signal of a $(N-2)^{th}$ level.

A first inverting module 305 is connected between the first node K and a third node P.

A feedback module 306 is connected between the first node K and the third node P.

The first output module 20 is connected between the first node K and the first signal output terminal Nout and is configured to output a first gate electrode driving signal.

The second output module 30 outputs the second gate electrode driving signal according to an electrical potential of the second node Q and an electrical potential of the third node P.

A first storage capacitor C1 comprises a first electrode plate C1a and a second electrode plate C1b. The first electrode plate C1a of the first storage capacitor C1 is connected to the second node Q. The second electrode plate C1b of the first storage capacitor C1 is connected to the second signal output terminal Pout.

A voltage adjustment module 307, the first terminal of the voltage adjustment module 307 is electrically connected to a first low potential line Nvgl1. A second terminal of the voltage adjustment module 307 is connected to a gate electrode of the first output transistor T10. A control terminal of the voltage adjustment module 307 is electrically connected to the third node P.

In the present embodiment, in a frame, the gate electrode driver circuit 300 comprises a stage S100 and a stage S200. In the stage S100, a pulse of each first gate electrode driving signal and a pulse of each second gate electrode driving signal would complete the output. In the stage S200, the pulse of each first gate electrode driving signal and the pulse of each second gate electrode driving signal are not required.

In the present embodiment, the cascade signal selection module 301 comprises a first cascade transistor T13 and a second cascade transistor T12. The first cascade transistor T13 is a dual gate transistor. Two gate electrodes of the first cascade transistor T13 and a gate electrode of the second cascade transistor T12 are connected to the initial signal line STV. A source electrode of the first cascade transistor T13 is connected to a second low potential line Pvgl. A drain electrode of the first cascade transistor T13 and a source electrode of the second cascade transistor T12 are connected to the fourth node O. A drain electrode of the second cascade transistor T12 is connected to a second high potential line Pvgh2.

In the present embodiment, pull-up control module 302 comprises a pull-up transistor T2. A gate electrode of the pull-up transistor T2 is connected to the second clock signal line XCK. A source electrode of the pull-up transistor T2 is connected to the fourth node O. A drain electrode of the pull-up transistor T2 is connected to the first node K.

In the present embodiment, the first filter module 303 comprises a first filter transistor T11 and a second storage capacitor C2. A gate electrode of the first filter transistor T11 and a third electrode plate C2a of the second storage capacitor C2 are connected to the reset signal lines RST. A source electrode of the first filter transistor T11 is connected to the first node K. A drain electrode of the first filter transistor T11 and a fourth electrode plate C2b of the second storage capacitor C2 are connected to the fifth node W.

In the present embodiment, the second filter module 304 comprises a second filter transistor T8, and a gate electrode of the second filter transistor T8 is connected to the first signal output terminal Nout of the driver unit 310 of a $(N-2)^{th}$ level. A source electrode of the second filter transistor T8 is connected to the fifth node W. A drain electrode of the second filter transistor T8 is connected to the second node Q.

In the present embodiment, the first inverting module 305 comprises a first inverting transistor T3 and a second inverting transistor T1. The second inverting transistor T1 is a dual gate transistor. A gate electrode of the first inverting transistor T3 and two gate electrodes of the second inverting transistor T1 are connected to the first node K. A source electrode of the first inverting transistor T3 is connected to the second high potential line Pvgh2. A drain electrode of the first inverting transistor T3 and a source electrode of the second inverting transistor T1 are connected to the third node P. A drain electrode of the second inverting transistor T1 is connected to the second low potential line Pvgl.

In the present embodiment, feedback module 306 comprises a first feedback transistor T4 and a second feedback transistor T5. A gate electrode of the first feedback transistor T4 is connected to a first clock signal line CK. A source electrode of the first feedback transistor T4 is connected to the first node K. A drain electrode of the first feedback transistor T4 is connected to a source electrode of the second feedback transistor T5. A gate electrode of the second feedback transistor T5 is connected to the third node P. A drain electrode of the second feedback transistor T5 is connected to a first high potential line Pvgh1.

In the present embodiment, the voltage adjustment module 307 comprises an adjustment transistor T14. The adjustment transistor T14 is a dual gate transistor. Two gate electrodes of the adjustment transistor T14 are connected to the third node P. A source electrode of the adjustment transistor T14 is connected to the first node K. A drain electrode of the adjustment transistor T14 is connected to the first low potential line Nvgl1.

In the present embodiment, the first output module 20 comprises the first output transistor T10 and the second output transistor T9. The first output transistor T10 is a dual gate transistor. The second output transistor T9 is a single gate transistor. A first gate electrode T10G of the first output transistor T10 and a second gate electrode T9G of the second output transistor T9 are connected to the first node K of the signal generation module 10. A first source electrode T9S of the second output transistor T9 is connected to the first high potential line Pvgh1. The first source electrode T9S of the first output transistor T10 and the second drain electrode T9D of the second output transistor T9 are connected to the first signal output terminal Nout. A first drain electrode T10D of the first output transistor T10 is connected to the first low potential line Nvgl1.

In the present embodiment, the second output module 30 comprises the third output transistor T6 and the fourth output transistor T7. A third gate electrode T6G of the third output transistor T6 is connected to the second node Q of the signal generation module 10. The third source electrode T6S of the third output transistor T6 is connected to the first clock signal line CK. The third drain electrode T6D of the third output transistor T6 and the fourth source electrode T7S of the fourth output transistor T7 are connected to the second signal output terminal Pout. A fourth gate electrode T7G of the fourth output transistor T7 is connected to the third node P of the signal generation module 10. The fourth drain electrode T7D of the fourth output transistor T7 is connected to the first high potential line Pvgh1.

In the present embodiment, the first cascade transistor T13, the second inverting transistor T1, the first output transistor T10, and the adjustment transistor T14 are N-type transistors. The second cascade transistor T12, the pull-up transistor T2, the first filter transistor T11, the second filter transistor T8, the first inverting transistor T3, the second output transistor T9, the third output transistor T6, the fourth output transistor T7, the first feedback transistor T4, and the second feedback transistor T5 are P-type transistors.

In the gate electrode driver circuit 300 provided by the present embodiment, under control of the third node P, the voltage adjustment module 307 can stabilize or lower the electrical potential of the gate electrode of the first output transistor T10 by the first low potential line Nvgl1 such that the first output transistor T10 is stably or better in a stop state to decrease the drain current to be able to further maintain the electrical potential of the first gate electrode driving signal in a high electrical potential or pulse amplitude, which improves the electrical potential stability of the gate electrode driving signal.

In the present embodiment, the voltage adjustment module 307 is configured to stabilize or reduce a low potential of the first node K. Alternatively, in another embodiment, the voltage adjustment module 307 is further configured to stabilize or lower the gate electrode electrical potential of the first output transistor T10 in a positive pulse duration of the first gate electrode driving signal.

It should be explained that the adjustment transistor T14 can stabilize or lower a gate electrode electrical potential of the first output transistor T10 in a positive pulse duration of the first gate electrode driving signal such that the first output transistor T10 is stably or better in a stop state to decrease the drain current to be able to further maintain the electrical potential of the first gate electrode driving signal in a high electrical potential or pulse amplitude, which improves the electrical potential stability of the gate electrode driving signal.

In the present embodiment, an internal node is the third node P. The second low potential line Pvgl and the first low potential line Nvgl1 are low potential lines with the same electrical potential. Also, a channel type of the adjustment transistor T14 is the same as a channel type of the first output transistor T10.

It should be explained that in the present embodiment, the first output transistor T10 and the adjustment transistor T14 can commonly share the same low potential line, which can reduce a quantity of wirings required by the gate electrode driver circuit 300. A channel type of the adjustment transistor T14 is the same as a channel type of the first output transistor T10 such that the adjustment transistor T14 can be turned on under a circumstance of the first output transistor T10 in a stop state to further lower an electrical potential of the gate electrode of the first output transistor T10.

Figure 5:
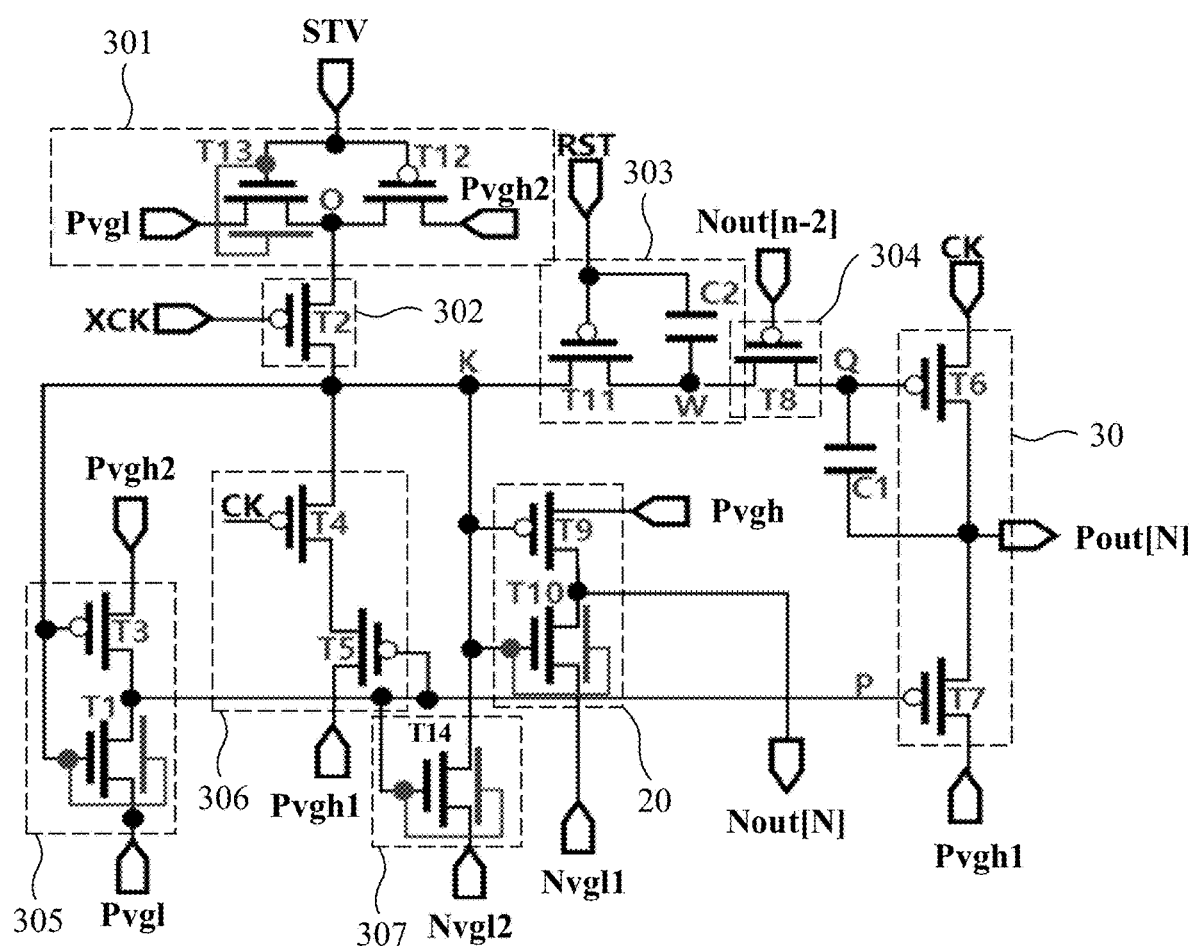
FIG. 5 is a second equivalent circuit diagram of the gate electrode driver circuit in the display panel of the present application.

In an embodiment, with reference to FIG. 5, the internal node can be the third node P. A channel type of the adjustment transistor T14 is the same as a channel type of the first output transistor T10. The first low potential line Nvgl1 transmits a first low potential signal, a third low potential line Nvgl2 transmits a second low potential signal. An electrical potential of the second low potential signal is lower than an electrical potential of the first low potential signal.

It should be explained that a channel type of the adjustment transistor T14 is the same as a channel type of the first output transistor T10, and can transmit a second low potential signal through the adjustment transistor T14 to a gate electrode of the first output transistor T10 under a circumstance of the first output transistor T10 in a stop state, which can further lower a gate electrode electrical potential of the first output transistor T10 to reduce a drain current of the first output transistor T10. As such, stability of a low potential of the second node QK and a low potential of the intervening node W can be improved.

In one of the embodiments, a difference between the electrical potential of the first low potential signal and the electrical potential of the second low potential signal is greater than or equal to 2V.

It should be explained that the present embodiment not only can lower the drain current of the first output transistor T10, but also can adjust and positively shift a threshold voltage of the first output transistor T10 to further increase a range of the threshold voltage of the first output transistor T10.

Aiming at the structure of FIG. 3, film layers of the display panel 100 of the present application are described as follows.

Figure 6:
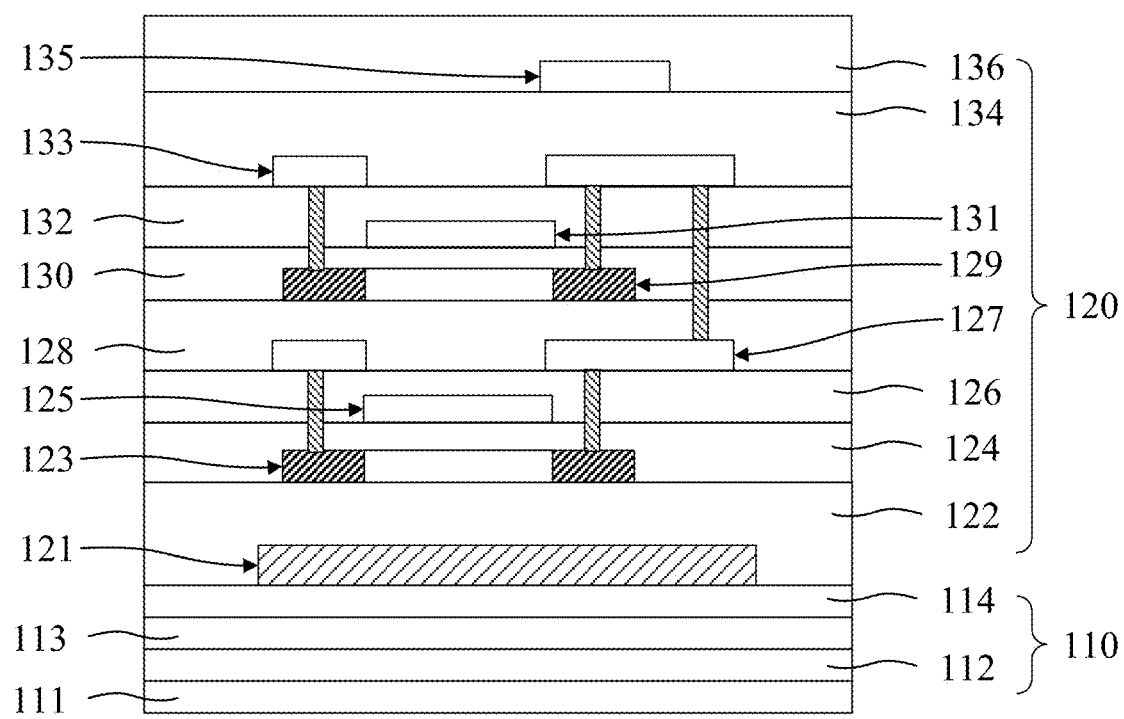
FIG. 6 is a film layer schematic view of the display panel of the present application.

With reference to FIGS. 1 and 6, a display region AA and a non-display region NA of the display panel 100 can be disposed with an underlay substrate 110 and an array driver layer 120 disposed on the underlay substrate 110. In the display region AA, the display panel 100 can also be disposed with a pixel definition layer disposed on the array driver layer 120, a light emitting device layer disposed with the pixel definition layer in the same layer, and an encapsulation layer disposed on the pixel definition layer. A film layer structure of the non-display region NA will be mainly described as follows.

In the present embodiment, the underlay substrate 110 supports each layer disposed on the underlay substrate 110. When the display panel 100 is a bottom emission-type light emitting display device or a dual surface emission-type light emitting display device, a transparent underlay substrate is used. When the display panel 100 is a top emission-type light emitting display device, a translucent or opaque underlay substrate and a transparent underlay substrate can be used.

In the present embodiment, the underlay substrate 110 is configured to support film layers disposed on the underlay substrate 110. The underlay substrate 110 can be made of insulation material such as glass, quartz, or polymer resin. The underlay substrate 110 can be a rigid underlay or a flexible underlay that can be bent, folded, or curved. An example of flexible material for the flexible underlay comprises polyimide (PI), but is not limited to polyimide (PI).

In the present embodiment, the underlay substrate 110 can comprise a first flexible base 111, a first barrier layer 112, a second flexible base 113, and a second barrier layer 114 that are stacked on one another. The first flexible base 111 and the second flexible base 113 can be formed by the same material such as polyimide. The first barrier layer 112 and the second barrier layer 114 can be formed by inorganic material, for example, the inorganic material including at least one of SiOx and SiNx.

In the present embodiment, the first flexible base 111 is formed by coating polymer material on a supporting base (not shown) and then curing the polymer material. The second flexible base 113 is formed by coating material the same as the material of the first flexible base 111 and curing the material. Also, the second flexible base 113 is formed by a method the same as the method forming the first flexible base 111. Each of the first flexible base 111 and the second flexible base 113 can be formed with a thickness ranging from 8 μm to 12 μm. Furthermore, when the underlay substrate 110 is formed by the first flexible base 111 and the second flexible base 113, perforations and cracks formed during manufacturing the first flexible base 111 are covered by the second flexible base 113 such that the above defects can be removed.

With reference to FIG. 6, the array driver layer 120 can comprise a plurality of thin film transistors, and the thin film transistors can be etched barrier type, rear channel etched type, or be classified according to locations of the gate electrode and the active layer into structures of bottom gate thin film transistors, top gate thin film transistors, or be classified according to performance of the thin film transistors into N-type thin film transistors and P-type thin film transistors. The thin film transistor in FIG. 6 does not represent any transistor in FIG. 2, but is only a schematic view of each film layer of the display panel 100 of the present application.

With reference to FIG. 6, the array driver layer 120 can comprise a light shielding layer 121 disposed on the underlay substrate 110, a buffer layer 122 disposed on the light shielding layer 121, a first active layer 123 disposed on the buffer layer 122, a first gate insulation layer 124 disposed on the first active layer 123, a first gate electrode layer 125 disposed on the first gate insulation layer 124, a second gate insulation layer 126 disposed on the first gate electrode layer 125, a second gate electrode layer 127 disposed on the second gate insulation layer 126, a third gate insulation layer 128 disposed on the second gate electrode layer 127, a second active layer 129 disposed on the third gate insulation layer 128, a fourth gate insulation layer 130 disposed on the second active layer 129, a third gate electrode layer 131 disposed on the fourth gate insulation layer 130, a first interlayer insulation layer 132 disposed on the third gate electrode layer 131, a first source and drain electrode layer 133 disposed on the first interlayer insulation layer 132, a second interlayer insulation layer 134 disposed on the first source and drain electrode layer 133, a second source and drain electrode layer 135 disposed on the second interlayer insulation layer 134, and a planarization layer 136 disposed on the second source and drain electrode layer 135.

With reference to FIG. 6, the light shielding layer 121 is disposed on the second barrier layer 114. The light shielding layer 121 is configured to shield and prevent external light from entering the thin film transistors through a bottom portion. Material of the light shielding layer 121 can be made of black light shielding material, for example, black light shielding metal or black organic material.

With reference to FIG. 6, the buffer layer 122 is disposed on the light shielding layer 121. The buffer layer 122 is configured to insulate the light shielding layer 121 and metal material of the upper layer. Material of the buffer layer 122 can be constituted by a composite composed of nitrogen element, silicon element, and oxygen element, for example, single layer silicon oxide film layer, or a lamination structure of silicon oxide-silicon nitride.

With reference to FIG. 6, the first active layer 123 is disposed on the buffer layer 122. The second active layer 129 can be disposed on the third gate insulation layer 128. Material of the first active layer 123 and the second active layer 129 material can be an indium gallium zinc oxide semiconductor, amorphous silicon or low-temperature polycrystalline silicon. For example, in the present application, material of the first active layer 123 can be low-temperature polycrystalline silicon, and material of the second active layer 129 can be a indium gallium zinc oxide semiconductor.

With reference to FIG. 6, the first gate insulation layer 124, the second gate insulation layer 126, the third gate insulation layer 128, the fourth gate insulation layer 130, the first interlayer insulation layer 132, and the second interlayer insulation layer 134 are disposed on corresponding metal layers or semiconductor layers respectively, and are separately disposed from each other in different metal layers or semiconductor layers. Material of the first gate insulation layer 124, the second gate insulation layer 126, the first interlayer insulation layer 132, the third gate insulation layer 128, the fourth gate insulation layer 130, and the second interlayer insulation layer 134 can be an inorganic matter composed of silicon, oxygen, and nitride or organic material with a planarization characteristic.

With reference to FIG. 6, the first gate electrode layer 125, the second gate electrode layer 127 and the third gate electrode layer 131 are disposed on corresponding insulation layers respectively. Material of the first gate electrode layer 125, the second gate electrode layer 127, and the third gate electrode layer 131 can be copper, molybdenum, or molybdenum titanium alloy.

With reference to FIG. 6, the first source and drain electrode layer 133 is disposed on the first interlayer insulation layer 132. The second source and drain electrode layer 135 is disposed on the second interlayer insulation layer 134. Material of the first source and drain electrode layer 133 and the second source and drain electrode layer 135 can be copper, molybdenum titanium alloy, copper, or titanium.

With reference to FIG. 6, the planarization layer 136 is disposed on an enter layer to ensure film layer flatness of the array driver layer 120. Material of the planarization layer 136 can be an inorganic matter composed of silicon, oxygen, and nitride or organic material with a planarization characteristic.

Figure 7:
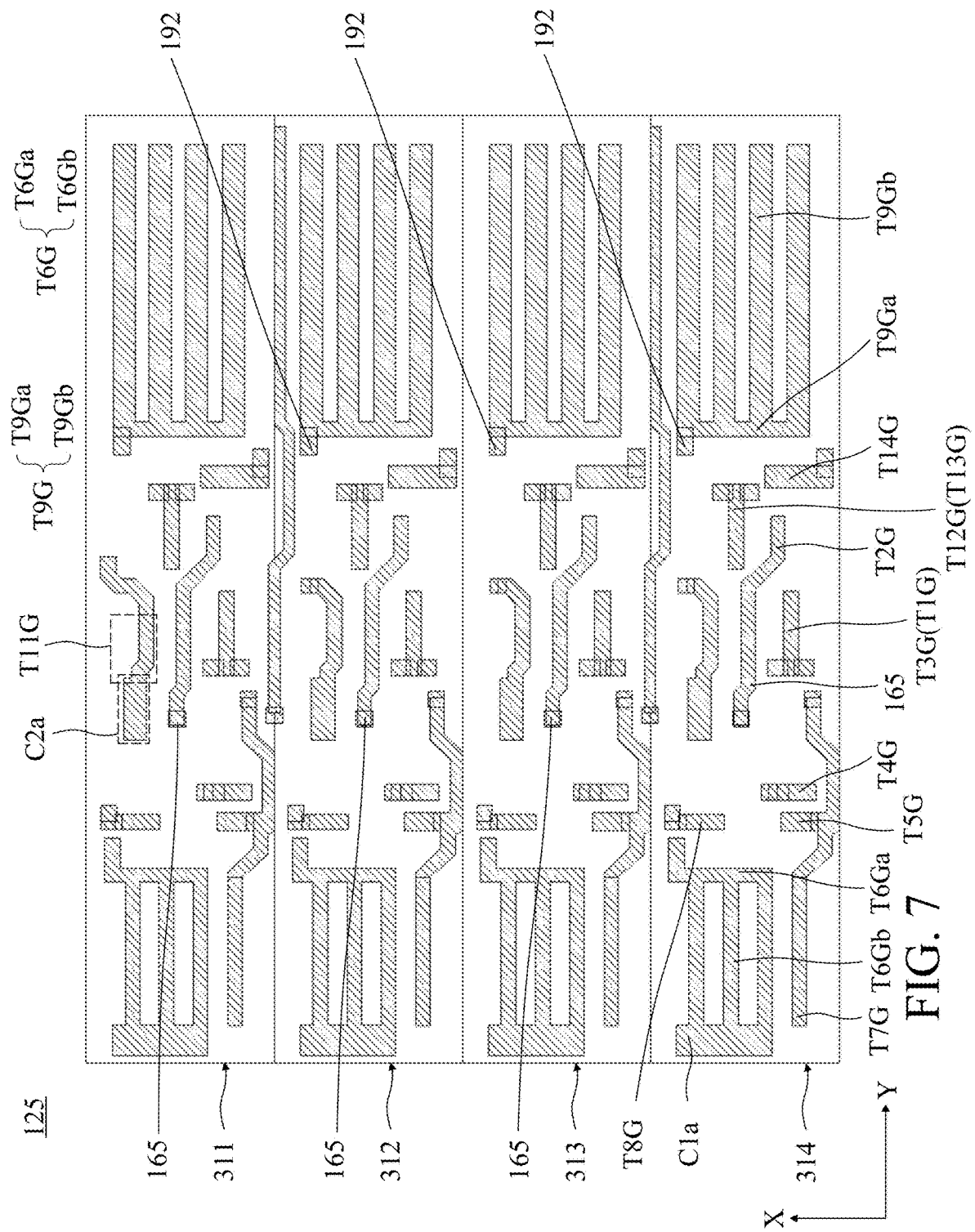
FIG. 7 is a film layer view of the first gate electrode layer in the display panel of the present application.

With reference to FIG. 7, FIG. 7 is a film layer view of the first gate electrode layer 125 in the display panel 100 of the present application.

In the present embodiment, the first gate electrode layer 125 can comprise the second gate electrode T9G and the third gate electrode T6G. The second gate electrode T9G is disposed on the second active portion T9A. Along the second direction Y, a length of the second gate electrode T9G is greater than a length of the third gate electrode T6G, and an area of the second gate electrode T9G is greater than an area of the third gate electrode T6G.

In the present embodiment, because the second output transistor T9 is configured to output a first gate electrode driving signal, the third output transistor T6 is configured to output a second gate electrode driving signal. Because a load of the first gate electrode driving signal is greater than a load of the second gate electrode driving signal, to increase an output load of the first output module 20, the present application makes an area of the second gate electrode T9G greater than an area of the third gate electrode T6G.

With reference to FIG. 7, the second gate electrode T9G can comprise a second trunk gate electrode T9Ga and a plurality of second branch gate electrodes T9Gb spaced from one another. The second trunk gate electrode T9Ga extends along the first direction X. The second branch gate electrodes T9Gb extend along the second direction Y. An end of each of the second branch gate electrodes T9Gb facing the signal generation module 10 is electrically connected to the second trunk gate electrode T9Ga. For example, the second gate electrode T9G can comprise one second trunk gate electrode T9Ga and four second branch gate electrodes T9Gb.

With reference to FIG. 7, the third gate electrode T6G can comprise a third trunk gate electrode T6Ga and a plurality of third branch gate electrodes T6Gb spaced from one another. The third trunk gate electrode T6Ga extends along the first direction X. The third branch gate electrodes T6Gb extend along the second direction Y. An end of each of the third branch gate electrodes T6Gb facing the signal generation module 10 is electrically connected to the third trunk gate electrode T6Ga. For example, the third gate electrode T6G comprises one third trunk gate electrode T6Ga and three third branch gate electrodes T6Gb.

In the present embodiment, lengths and quantity of the strip-like branch gate electrodes along the second direction Y are in a positive correlation with an output load of the output transistor. Therefore, to improve the driving ability of the second gate electrode T9G and the third gate electrode T6G, the present application sets the second gate electrode T9G and the third gate electrode T6G as a plurality of strip-like branch gate electrodes disposed separately. Each of the strip-like branch gate electrodes bears the load of a corresponding transistor. The strip-like branch electrode corresponds to a channel of an active portion of a corresponding transistor. A portion between adjacent two strip-like branch gate electrode corresponds to a source and drain electrode of an upper layer. A complex electrical field formed by the strip-like branch gate electrodes disposed separately can improve the driving ability of the transistor.

In the present embodiment, along the first direction X, an interval between adjacent two of the second branch gate electrodes T9Gb can be equal to an interval between adjacent two of the third branch gate electrodes T6Gb.

With reference to FIG. 7, the first gate electrode layer 125 further comprises the fourth gate electrode T7G. The fourth gate electrode T7G extends along the second direction Y. The third branch gate electrodes T6Gb in the fourth gate electrode T7G and the third gate electrode T6G are disposed parallelly and spaced from one another.

In the present embodiment, because the third output transistor T6 is connected to the first clock signal line CK, a load to be borne by the third output transistor T6 is larger, and therefore, the present application disposes three strip-like branch gate electrodes on the third gate electrode T6G. However, the fourth gate electrode T7G is not connected to a corresponding clock signal line, a load to be borne by the fourth output transistor T7 is smaller, and therefore, the fourth gate electrode T7G is only disposed with one strip-like branch gate electrode.

In the present embodiment, along the first direction X, an interval between the fourth gate electrode T7G and an adjacent one of the third branch gate electrodes T6Gb can be equal to an interval between adjacent two of the third branch gate electrodes T6Gb. Namely, the interval between adjacent two of the second branch gate electrodes T9Gb, the interval between adjacent two of the third branch gate electrodes T6Gb, and the interval between the fourth gate electrode T7G and an adjacent one of the third branch gate electrodes T6Gb are equal. Namely, the intervals among the strip-like branch electrodes are equal, which lowers a patterning difficulty.

With reference to FIG. 7, the first gate electrode layer 125 further comprises the first electrode plate C1a, ends of the third branch gate electrodes T6Gb away from the signal generation module 10 are connected to the first electrode plate C1a. For example, the first electrode plate C1a are connected to three third branch gate electrodes T6Gb, and the three third branch gate electrodes T6Gb transmit voltage signals to different locations of the first electrode plate C1a such that any region of the first electrode plate C1a can simultaneously receive voltage signals transmitted by the three third branch gate electrodes T6Gb.

With reference to FIG. 7, along the second direction Y, a width of the first electrode plate C1a is greater than a width of the third trunk gate electrode T6Ga. Because a capacitor amount of the storage capacitor is in a positive correlation with the right opposite display panel of the electrode plate in the storage capacitor. Therefore, the present application, in a limited space, can make a width of the first electrode plate C1a greater than a width of the third trunk gate electrode T6Ga to increase an area of the first electrode plate C1a to increase a right opposite area between the two electrode plates and increase a capacitor amount of the first storage capacitor C1.

With reference to FIG. 7, the first gate electrode layer 125 further comprises a gate electrode T2G of the pull-up transistor T2, a gate electrode T3G of the first inverting transistor T3, a gate electrode T4G of the first feedback transistor T4, a gate electrode T5G of the second feedback transistor T5, a gate electrode T8G of the second filter transistor T8, a gate electrode T11G of the first filter transistor T11, a gate electrode T12G of the second cascade transistor T12, and the third electrode plate C2a of the second storage capacitor C2.

In the present embodiment, the gate electrode T2G of the pull-up transistor T2, the gate electrode T3G of the first inverting transistor T3, the gate electrode T11G of the first filter transistor T11, the gate electrode T12G of the second cascade transistor T12, and the third electrode plate C2a of the second storage capacitor C2 extend along the second direction Y. The gate electrode T12G of the second cascade transistor T12 is disposed near the first output module 20. The gate electrode T3G of the first inverting transistor T3, the gate electrode T2G of the pull-up transistor T2, the gate electrode T11G of the first filter transistor T11 are sequentially arranged in the first direction X in a middle region of the signal generation module 10. The gate electrode T12G of the second cascade transistor T12 and the third electrode plate C2a of the second storage capacitor C2 are in the same straight line, and the gate electrode T11G of the first filter transistor T11 is directly connected to the third electrode plate C2a of the second storage capacitor C2.

In the present embodiment, the gate electrode T4G of the first feedback transistor T4, the gate electrode T5G of the second feedback transistor T5, and the gate electrode T8G of the second filter transistor T8 extend along the first direction X, and these three gate electrodes are disposed near the second output module 30. The gate electrode T4G of the first feedback transistor T4 and the gate electrode T5G of the second feedback transistor T5 are arranged abreast along the second direction Y. Also, the gate electrode T4G of the first feedback transistor T4 is disposed away from the fourth gate electrode T7G, and the gate electrode T5G of the second feedback transistor T5 is disposed near the fourth gate electrode T7G. The gate electrode T5G of the second feedback transistor T5 and the gate electrode T8G of the second filter transistor T8 are arranged along the first direction X. The gate electrode T5G of the second feedback transistor T5 is directly connected to an extension section of the fourth gate electrode T7G of the fourth output transistor T7 along the second direction Y.

In the present embodiment, the first gate electrode layer 125 further comprises a first gate electrode T1G of the second inverting transistor T1, a first gate electrode T13G of the first cascade transistor T13, and a first gate electrode T14G of the adjustment transistor T14. The first gate electrode T1G of the second inverting transistor T1 and the first gate electrode T13G of the first cascade transistor T13 extend along the second direction Y. The first gate electrode T1G of the second inverting transistor T1 shares the gate electrode T3G of the first inverting transistor T3. The first gate electrode T13G of the first cascade transistor T13 shares the gate electrode T12G of the second cascade transistor T12. The first gate electrode T14G of the adjustment transistor T14 extends along the first direction X.

Figure 8:
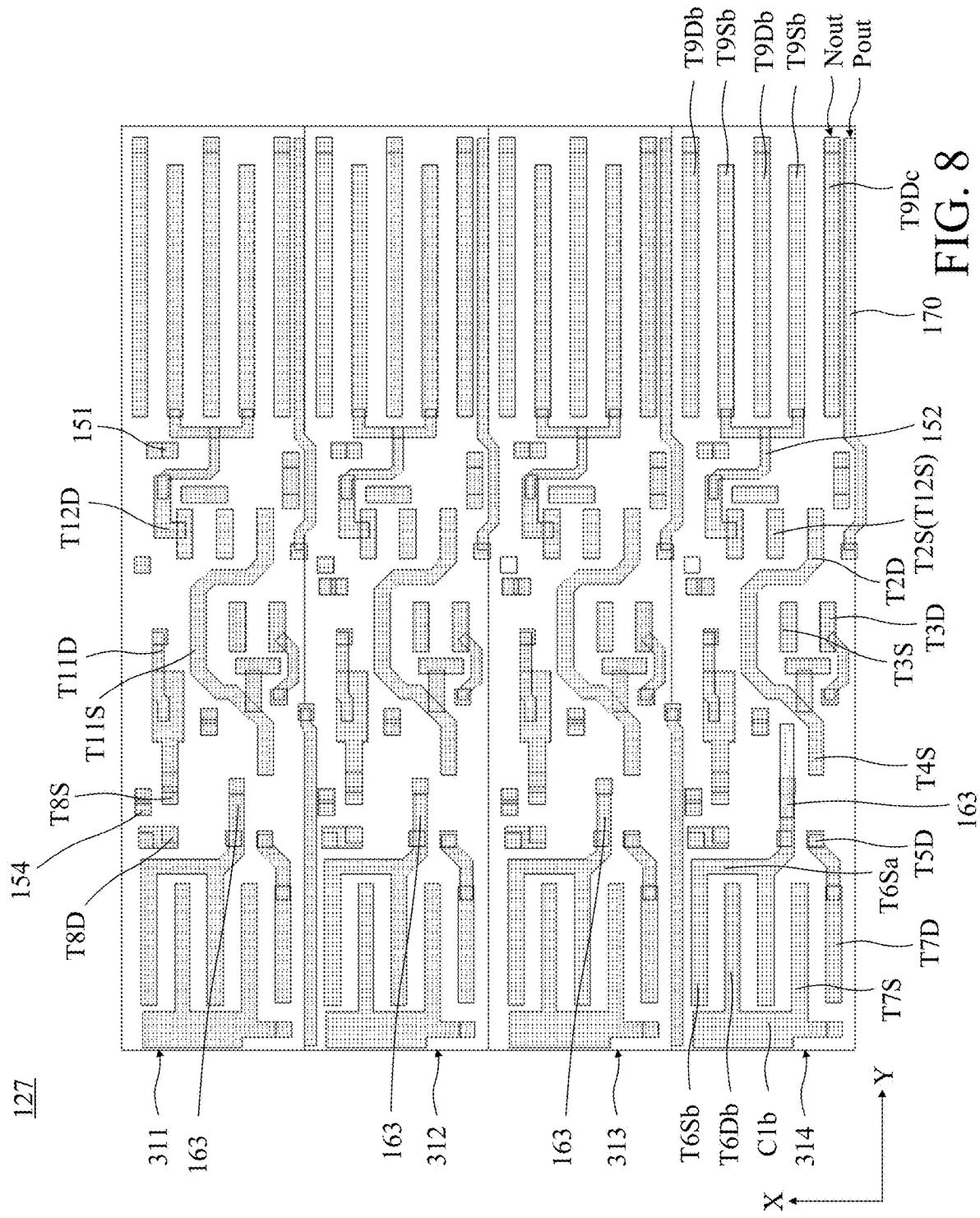
FIG. 8 is a film layer view of a second gate electrode layer in the display panel of the present application.

With reference to FIG. 8, FIG. 8 is a film layer view of the second gate electrode layer 127 in the display panel 100 of the present application.

In the present embodiment, the second gate electrode layer 127 comprises the second electrode plate C1b of the first storage capacitor C1. The first electrode plate C1a is disposed opposite to and is parallel to the second electrode plate C1b. An orthographic projection of the first electrode plate C1a on the second electrode plate C1b is located within the second electrode plate C1b. Because a capacitor amount of storage capacitor is in a positive correlation with a right opposite display panel of an electrode plate in the storage capacitor, the present application can, in a limited space, can make an orthographic projection of the first electrode plate C1a on the second electrode plate C1b located within the second electrode plate C1b. Namely, an area of the first electrode plate C1a is less than or equal to an area of the second electrode plate C1b. In the present embodiment, an area of the first electrode plate C1a is less than an area of the second electrode plate C1b. Namely, the area of the second electrode plate C1b is increased as much as possible to improve a right opposite area between the two electrode plates and increase a capacitor amount of the first storage capacitor C1 to enhance an output stability of the first signal output terminal Nout.

In the present embodiment, the second gate electrode layer 127 further comprises the fourth electrode plate C2b of the second storage capacitor C2, and the fourth electrode plate C2b of the second storage capacitor C2 extends along the second direction Y.

Figure 9:
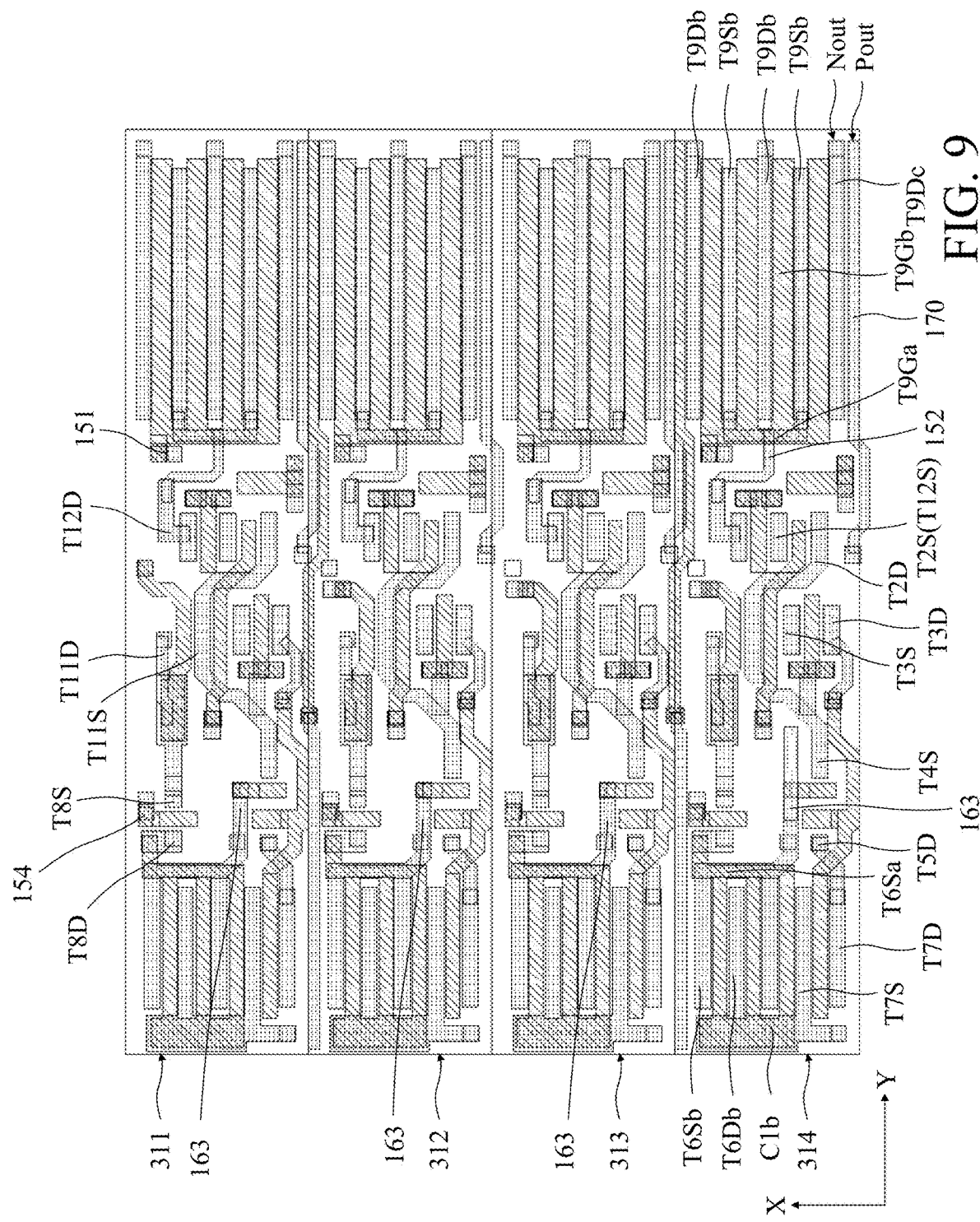
FIG. 9 is a stacked film layer view of the first gate electrode layer and the second gate electrode layer stacked in the display panel of the present application.

With reference to FIG. 9, FIG. 9 is a stacked film layer view of the first gate electrode layer 125 and the second gate electrode layer 127 stacked in the display panel 100 of the present application.

In the present embodiment, an orthographic projection of the third electrode plate C2a on the fourth electrode plate C2b is located within the fourth electrode plate C2b. Namely, an area of the third electrode plate C2a is less than or equal to an area of the fourth electrode plate C2b. In the present embodiment, the area of the third electrode plate C2a is less than the area of the fourth electrode plate C2b. Namely, the area of the fourth electrode plate C2b is increased as much as possible to improve a right opposite area between the two electrode plates and increase a capacitor amount of the second storage capacitor C2 to improve the stability of a voltage of the fifth node W.

In the present embodiment, a capacitor amount of the second storage capacitor C2 is greater than 50 F.

In the present embodiment, an area of the first electrode plate C1a is greater than an area of the third electrode plate C2a, and an area of the second electrode plate C1b is greater than an area of the fourth electrode plate C2b. A ratio of a capacitor amount of the first storage capacitor C1 to a capacitor amount of the second storage capacitor C2 is greater than 2. Because the first electrode plate C1a in the first storage capacitor C1 is connected to the third gate electrode T6G of the third output transistor T6, the second electrode plate C1b in the first storage capacitor C1 is connected to the third drain electrode T6D of the third output transistor T6, and the third source electrode T6S of the third output transistor T6 is connected to the first clock signal line CK. Output signals of the clock signal line at different moments would be inverted, which will affect the stability of output signals of the second signal output terminal Pout connected to the third drain electrode T6D of the third output transistor T6. Therefore, the present application increases the capacitor amount of the first storage capacitor C1 to guarantee the output stability of the first signal output terminal Nout.

In the structure of FIG. 8, the second gate electrode layer 127 further comprises a second source electrode T9S, a second drain electrode T9D, a third source electrode T6S, a third drain electrode T6D, a fourth source electrode T7S, and a fourth drain electrode T7D.

In the present embodiment, the second drain electrode T9D comprises a plurality of second branch drain electrodes T9Db that are disposed parallelly and spaced from one another. The second source electrode T9S comprises a plurality of second branch source electrodes T9Sb that are disposed parallelly and spaced from one another. The second branch drain electrodes T9Db and the second branch source electrodes T9Sb extend along the second direction Y.

In the present embodiment, along a top view direction of the display panel 100, the two second branch drain electrodes T9Db on two sides of the second branch drain electrodes T9Db are disposed on two sides of the second gate electrode T9G respectively. At least one of the second branch drain electrodes T9Db and the second branch source electrodes T9Sb on an inner side of the second branch drain electrodes T9Db is disposed between the second branch gate electrodes T9Gb. For example, in the structure of FIG. 8, the second source electrode T9S comprises two second branch source electrodes T9Sb, the second drain electrode T9D comprises three second branch drain electrodes T9Db, the two second branch source electrodes T9Sb and the three second branch drain electrodes T9Db are arranged alternately along the first direction X. Namely, the two second branch source electrodes T9Sb can be disposed between adjacent two of the second branch drain electrodes T9Db. Also, the two second branch drain electrodes T9Db on an outermost side of the three second branch drain electrodes T9Db are disposed on two sides of the second gate electrode T9G respectively, one second branch drain electrode T9Db and two second branch source electrodes T9Sb are disposed between the second branch gate electrodes T9Gb.

With reference to FIG. 8, the third source electrode T6S can comprise a third trunk source electrode T6Sa and two third branch source electrodes T6Sb spaced from each other. An end of each of the two third branch source electrodes T6Sb near the signal generation module 10 is connected to the third trunk source electrode T6Sa. The third drain electrode T6D comprises a third branch drain electrode T6Db. An end of the third branch drain electrode T6Db away from the signal generation module 10 is connected to the second electrode plate C1b of the first storage capacitor C1. Two of the third branch source electrodes T6Sb and the third branch drain electrode T6Db are arranged alternately along the first direction X.

In the present embodiment, the fourth source electrode T7S and the fourth drain electrode T7D extend along the second direction Y. The fourth source electrode T7S is disposed near a third branch source electrode T6DS. The fourth drain electrode T7D is disposed on a side of the fourth source electrode T7S away from the third branch source electrode T6DS.

Figure 10:
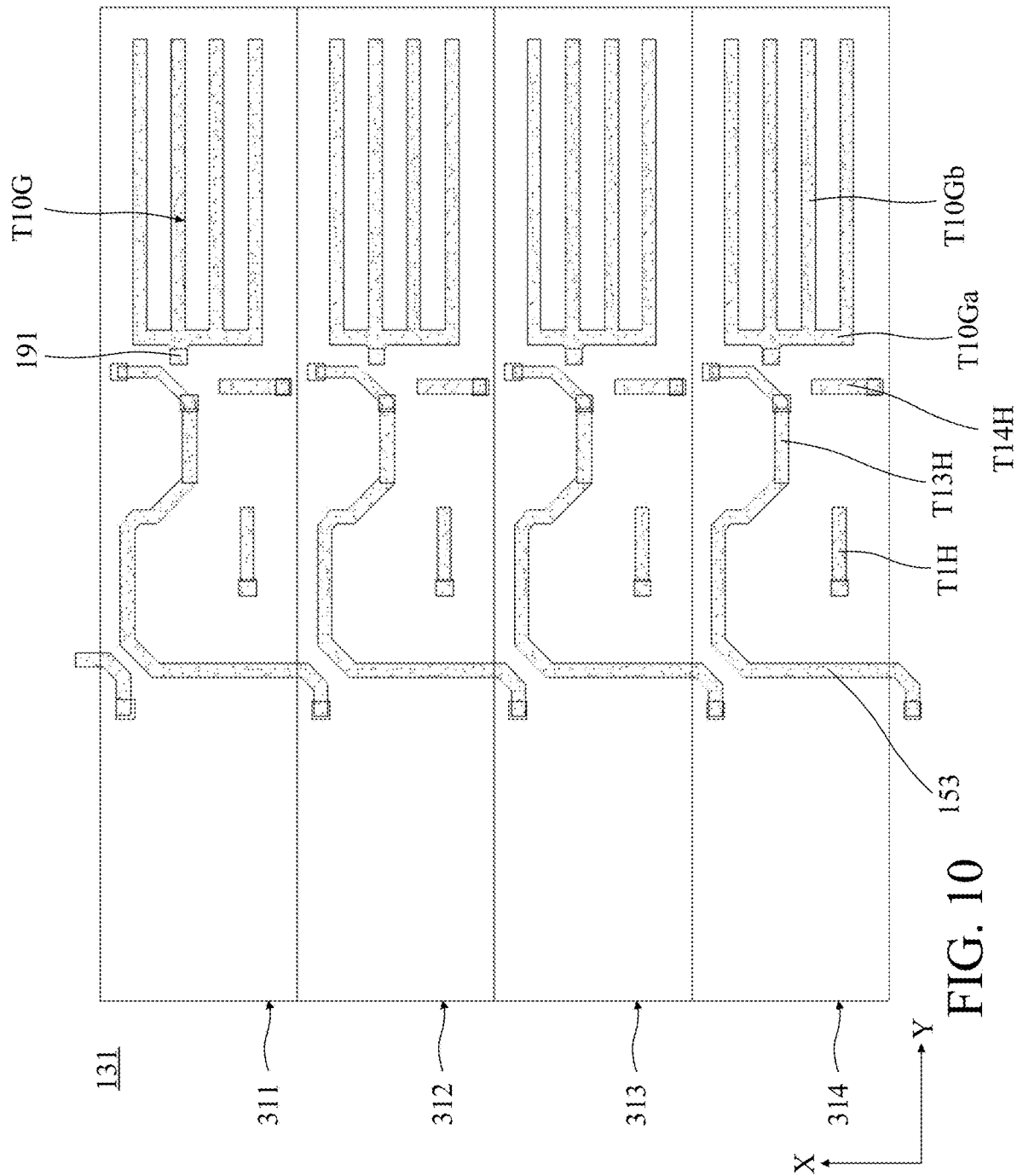
FIG. 10 is a film layer view of a third gate electrode layer in the display panel of the present application.

With reference to FIG. 10, FIG. 10 is a film layer view of the third gate electrode layer 131 in the display panel 100 of the present application.

In the present embodiment, the third gate electrode layer 131 comprises the first gate electrode T10G disposed on the first active portion T10A. The first gate electrode T10G comprises a first trunk gate electrode T10Ga and a plurality of first branch gate electrodes T10Gb connected to the first trunk gate electrode T10Ga. The first trunk gate electrode T10Ga extends along the first direction X. The first branch gate electrodes T10Gb extend along the second direction Y. The first trunk gate electrode T10Ga is disposed on a side of the first output module 20 near signal output module 10. For example, the first gate electrode T10G can comprise one first trunk gate electrode T10Ga and four first branch gate electrodes T10Gb.

In the present embodiment, because the first branch gate electrodes T10Gb are required to serve as a shielding layer to dope ions into the first active portion T10A, a length of a channel of the first active portion T10A along the first direction X is equal to a length of the first branch gate electrode T10Gb in the first gate electrode T10G along the first direction X.

In the present embodiment, an orthographic projection of the first trunk gate electrode T10Ga on the second trunk gate electrode T9Ga coincides with the second trunk gate electrode T9Ga, and orthographic projections of the first branch gate electrodes T10Gb on the second branch gate electrodes T9Gb are located within the second branch gate electrodes T9Gb respectively. Namely, to guarantee that external light enters the first active portion T10A, the present application can make a width of a branch gate electrode of a lower layer greater than a width of a branch gate electrode of an upper layer. An interval between adjacent two the first branch gate electrodes T10Gb can be less than an interval between adjacent two of the second branch gate electrodes T9Gb in the second output transistor T9. Also, the interval between adjacent two of the second branch gate electrodes T9Gb can be less than the interval between adjacent two the first branch gate electrodes T10Gb. Namely, along the first direction, a width of the first branch gate electrodes is less than a width of the second branch gate electrodes.

In the present embodiment, because a length of the first output transistor T10 along the second direction Y is equal to a length of the second output transistor T9 along the second direction Y, a length of the first branch gate electrodes can be equal to a length of the second branch gate electrodes along the second direction.

Figure 11:
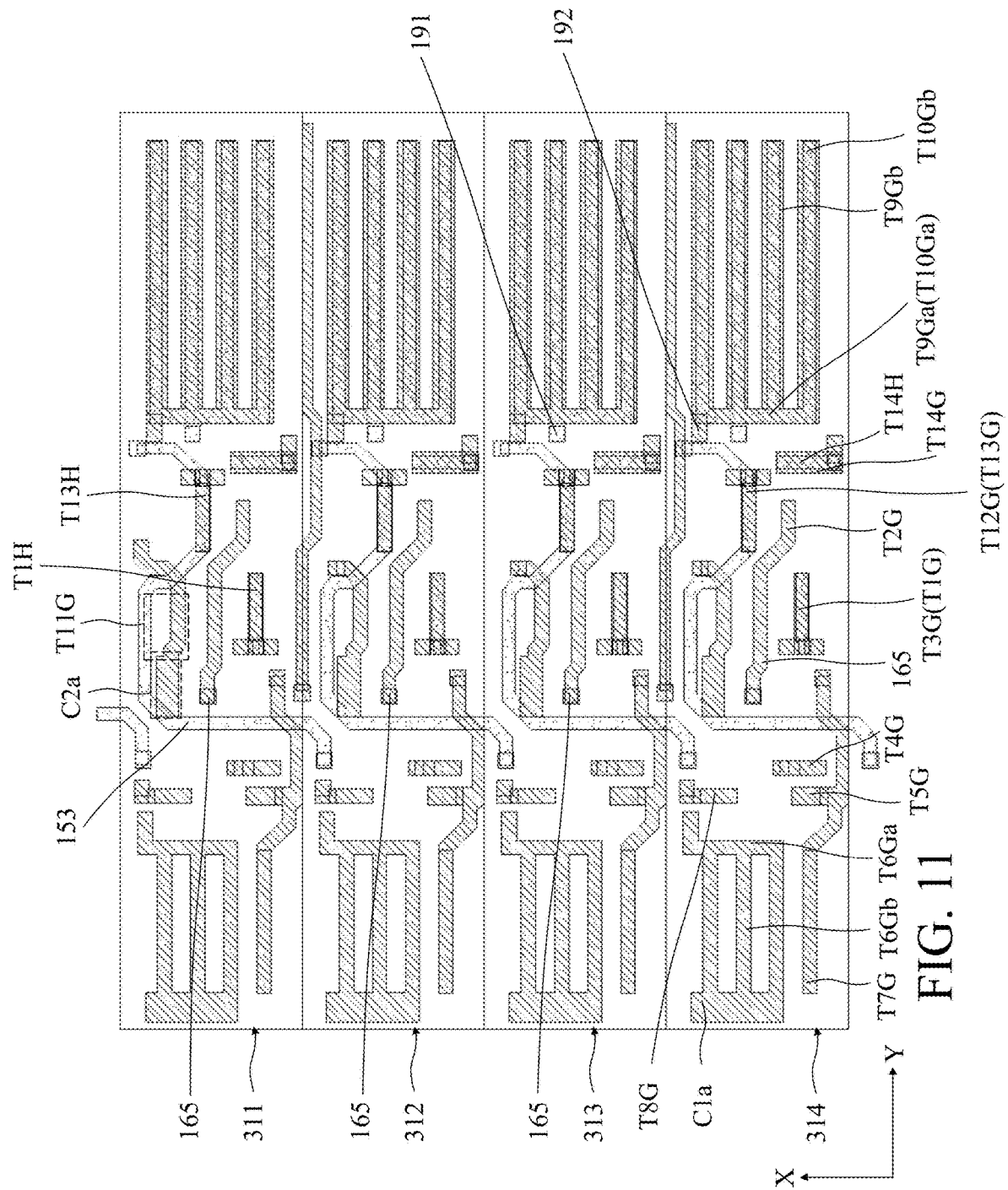
FIG. 11 is a stacked film layer view of the first gate electrode layer and the third gate electrode layer stacked in the display panel of the present application.

With reference to FIG. 11, FIG. 11 is a stacked film layer view of the first gate electrode layer 125 and the third gate electrode layer 131 stacked in the display panel 100 of the present application.

Because the second inverting transistor T1, the first cascade transistor T13, and the adjustment transistor T14 are metal oxide semiconductor transistors, and therefore, to increase the driving ability of the second inverting transistor T1, the first cascade transistor T13, and the adjustment transistor T14, the second inverting transistor T1, the first cascade transistor T13, and the adjustment transistor T14 can be dual gate transistors. Namely, the third gate electrode layer 131 can further comprise a second gate electrode T1H of the second inverting transistor T1, a second gate electrode T13H of the first cascade transistor T13, and a second gate electrode T14H of the adjustment transistor T14. The second gate electrode TIH of the second inverting transistor T1 and the second gate electrode T13H of the first cascade transistor T13 extend along the second direction Y. The second gate electrode T14H of the adjustment transistor T14 extends along the first direction X.

In the present embodiment, to prevent external light from entering the active portions in the second inverting transistor T1, the first cascade transistor T13, and the adjustment transistor T14, an orthographic projection of the second gate electrode TIH of the second inverting transistor T1 on a corresponding first gate electrode T1G is located within the corresponding first gate electrode TIG, an orthographic projection of the second gate electrode T13H of the first cascade transistor T13 on a corresponding first gate electrode T13G is located within the corresponding first gate electrode T13G, and an orthographic projection of the second gate electrode T14H of the adjustment transistor T14 on a corresponding first gate electrode T14G is located within the corresponding first gate electrode T14G. An area of the second gate electrode TIH of the second inverting transistor T1 is less than an area of the corresponding first gate electrode TIG. An area of the second gate electrode T13H of the first cascade transistor T13 is less than an area of the corresponding first gate electrode T13G. An area of the second gate electrode T14H of the adjustment transistor T14 is less than an area of the corresponding first gate electrode T14G.

Figure 12:
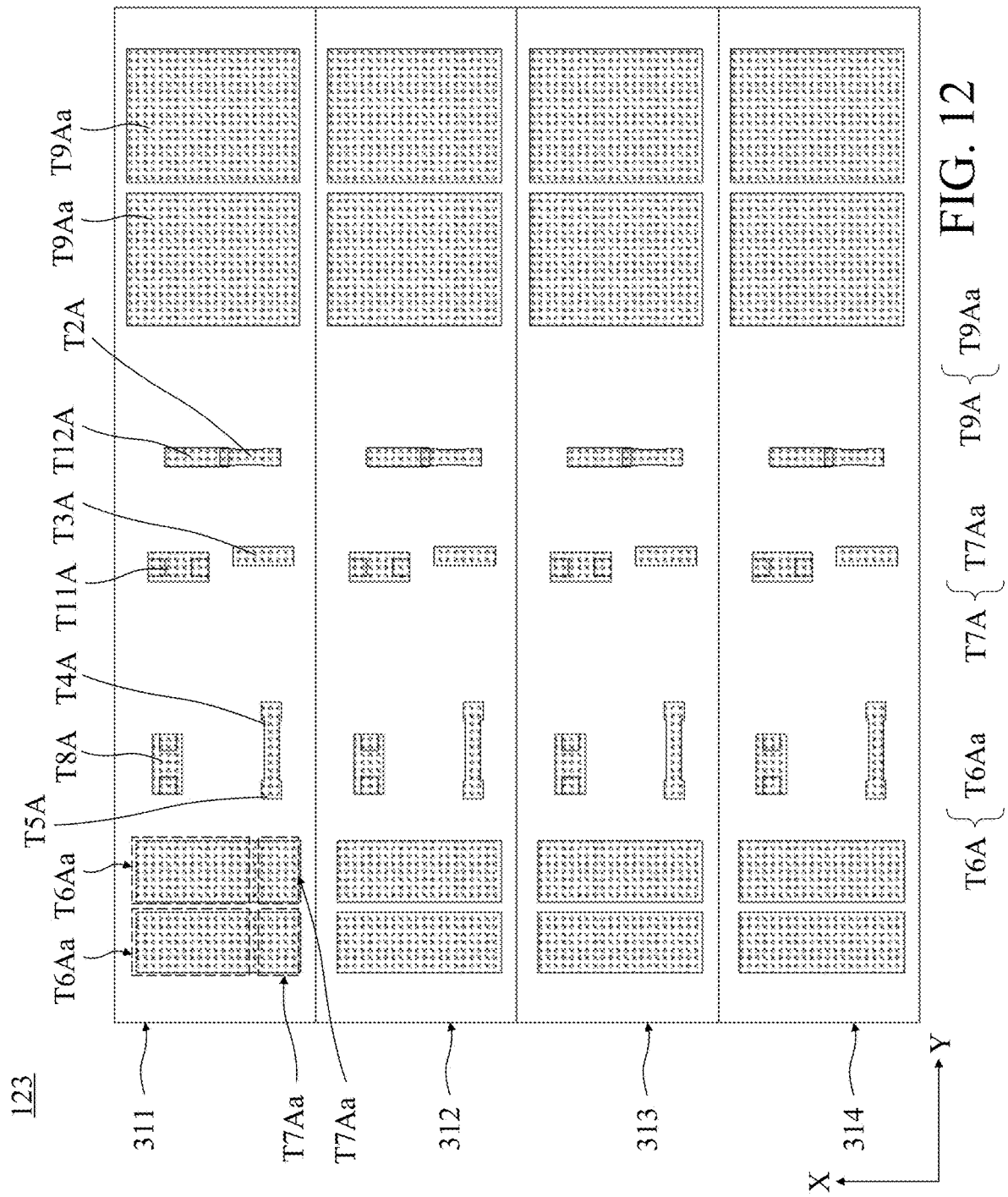
FIG. 12 is a film layer view of a first active layer in the display panel of the present application.
Figure 13:
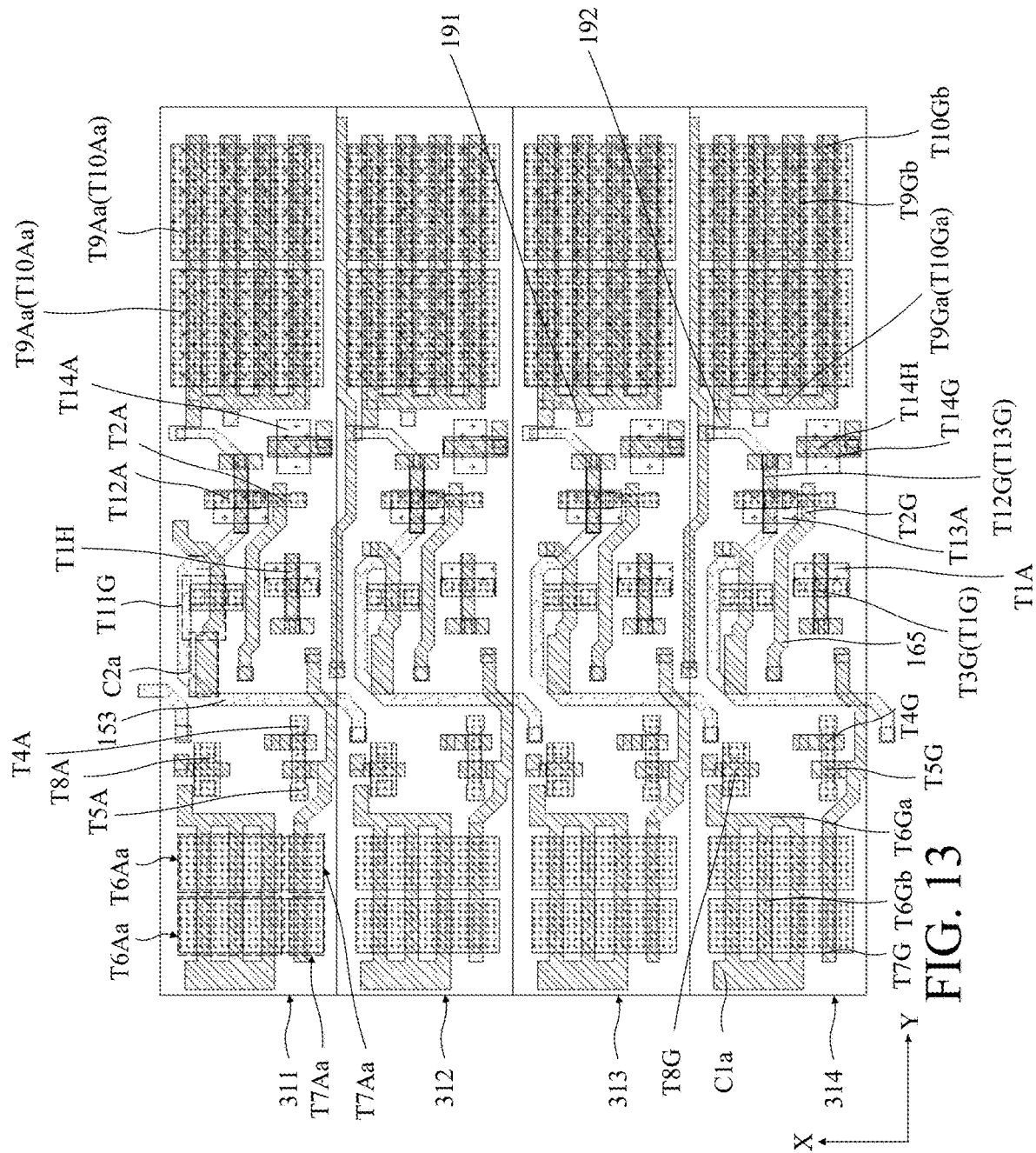
FIG. 13 is a stacked film layer view of the first gate electrode layer, the third gate electrode layer, the first active layer, and the second active layer stacked in the display panel of the present application.

With reference to FIGS. 12 and 13, FIG. 12 is a film layer view of the first active layer 123 of the display panel 100 of the present application, FIG. 13 is a stacked film layer view of the first gate electrode layer 125, the third gate electrode layer 131, the first active layer 123, and the second active layer 129 stacked in the display panel 100 of the present application.

In the present embodiment, the array driver layer 120 further comprises the first active layer 123 disposed between the first gate electrode layer 125 and the underlay substrate 110. The first active layer 123 comprises a silicon-containing semiconductor. The first active layer 123 comprises the second active portion T9A and the third active portion T6A. The second active portion T9A overlaps the second branch gate electrodes T9Gb. The third active portion T6A overlaps the third branch gate electrodes T6Gb.

In the present embodiment, the second output transistor T9 and the third output transistor T6 are top gate transistors. The second gate electrode T9G can serve as a shielding layer of the second active portion T9A for implementing ion doping to the second active portion T9A. The third gate electrode T6G can serve as a shielding layer of the third active portion T6A for implementing ion doping to the third active portion T6A. Therefore, a portion in the active portion overlapping a corresponding branch gate electrode is a channel, a non-overlapping portion in the active portion not is source electrode connection portion and drain electrode connection portion on two sides of the channel respectively. For example, in the structure of FIG. 13, the second active portion T9A overlaps four second branch gate electrodes T9Gb, and the third active portion T6A overlaps three third branch gate electrodes T6Gb. The second active portion T9A includes four second channels, and the third active portion T6A includes three third channels.

In the present embodiment, because lengths of the second branch gate electrodes T9Gb and the third branch gate electrodes T6Gb along the second direction Y are sufficiently long, therefore, to increase a width of the channel in the active portion, sizes of the second active portion T9A and the third active portion T6A along the second direction Y are increased as much as possible. Because when a size of the silicon-containing semiconductor along the second direction Y is over lare, static electricity concentration would occur on the active portion to possibly damage the active portion by the static electricity. Therefore, the present application can set the second active portion T9A and the third active portion T6A as two separately disposed sub-active portions.

With reference to FIGS. 12 and 13, the second active portion T9A can comprise two second sub-active portions T9Aa spaced from each other. The third active portion T6A comprises two third sub-active portions T6Aa spaced from each other. The second sub-active portions T9Aa and the third sub-active portions T6Aa extend along the first direction X. The two spaced second sub-active portions T9Aa and the two spaced third sub-active portions T6Aa reduce sizes of the second active portion T9A and the third active portion T6A along the second direction, which prevents a technical issue of static electricity concentration on the active portion.

In the present embodiment, along the second direction Y, a width of the second sub-active portions T9Aa is greater than a width of the third sub-active portions T6Aa. Because an output load of the second output transistor T9 is greater than an output load of the third output transistor T6, the present application increases the width of the second sub-active portions T9Aa to improve the second output load.

It should be explained that a width of the second sub-active portions T9Aa and a width of the third sub-active portions T6Aa correspond to a width of the sub-active portion along the second direction Y.

With reference to FIGS. 12 and 13, the first active layer 123 further comprises the fourth active portion T7A. The fourth active portion T7A comprises two fourth sub-active portions T7Aa spaced from each other. The two fourth sub-active portions T7Aa overlap the fourth gate electrode T7G. The fourth sub-active portions T7Aa are connected to corresponding ones of the third sub-active portions T6Aa. For example, one fourth active portion T7A overlaps one fourth gate electrode T7G, and the fourth active portion T7A comprises one fourth channel.

In the present embodiment, along the second direction Y, a width of the fourth sub-active portions T7Aa can be equal to a width of the third sub-active portions T6Aa.

In the present embodiment, to simplify processes, a pattern of the third active portion T6A can be connected to a pattern of the fourth active portion T7A, which increases a pattern area of the active portion in the second output module 30, reduces film formation precision of the active portion in the region and simplifies the film formation process.

In a structure of FIG. 13, the first active layer 123 further comprises an active portion T2A of the pull-up transistor T2, an active portion T3A of the first inverting transistor T3, an active portion T4A of the first feedback transistor T4, an active portion T5A of the second feedback transistor T5, an active portion T8A of the second filter transistor T8, an active portion T11A of the first filter transistor T11, and an active portion T12A of the second cascade transistor T12. The active portions of the pull-up transistor T2, the first inverting transistor T3, the first feedback transistor T4, the second feedback transistor T5, the second filter transistor T8, the first filter transistor T11, and the second cascade transistor T12 are disposed perpendicular to gate electrodes of corresponding transistors and overlap gate electrodes of corresponding transistors, and the overlapping portions are channels of the corresponding active portions.

Figure 14:
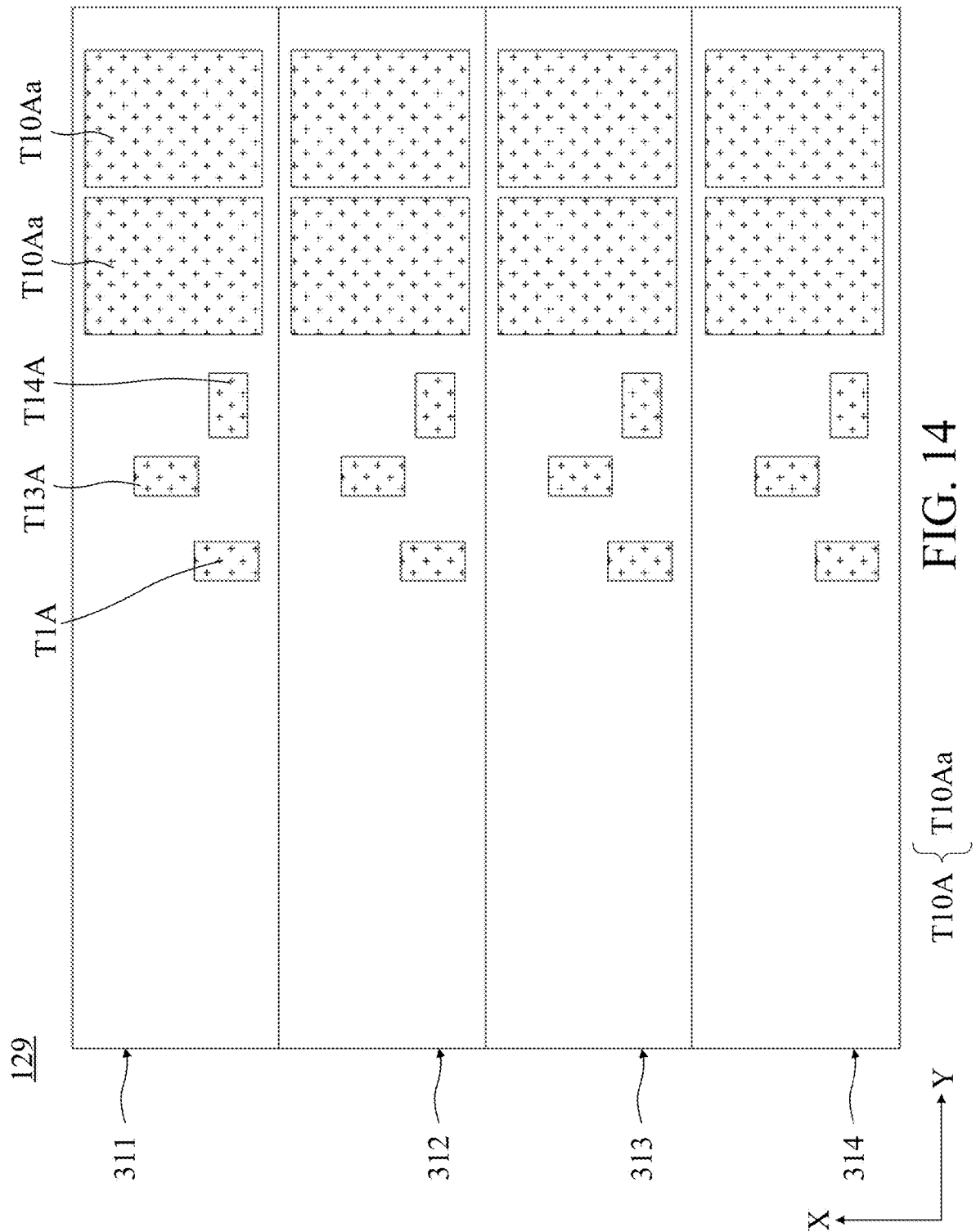
FIG. 14 is a film layer view of the second active layer in the display panel of the present application.

With reference to FIG. 14, FIG. 14 is a film layer view of the second active layer 129 in the display panel 100 of the present application.

In the present embodiment, the array driver layer 120 further comprises the second active layer 129 disposed between the third gate electrode layer 131 and the second gate electrode layer 127. The second active layer 129 comprises a metal oxide semiconductor. The second active layer 129 comprises the first active portion T10A. The first active portion T10A comprises two first sub-active portions T10Aa spaced from each other. The first sub-active portions T10Aa extend along the first direction X. The two first sub-active portions T10Aa overlap the first branch gate electrodes T10Gb.

In the present embodiment, a portion of the first active portion T10A overlapping the first branch gate electrodes T10Gb is a first channel of the first active portion T10A, a portion of the first active portion T10A not overlapping the first branch gate electrodes T10Gb is a source electrode connection portion and a drain electrode connection portion on two sides of the first channel respectively. For example, in the structure of FIGS. 13 and 14, the first active portion T10A overlaps four of the first branch gate electrodes T10Gb, and the first active portion T10A has four first channels.

In the present embodiment, because the first output transistor T10 is a metal oxide semiconductor transistor, the transistor of the type has an advantage of a low drain current but has a smaller mobility. Therefore, to improve the mobility of the first output transistor T10, a width of the channel in the first active portion T10A needs to be increased, namely, the width is equivalent to a size of the first sub-active portions T10Aa along the second direction Y. Because a length of the first output transistor T10 along the second direction Y is equal to a length of the second output transistor T9 along the second direction Y, therefore, to increase the width of the channel as much as possible, the length of the first active portion T10A of the present application can be equal to the length of the second active portion T9A.

In the present embodiment, because the first channel is disposed above the second channel, and the first channel corresponds to the first branch gate electrodes in the first gate electrode T10G, and the second channel corresponds to the second branch gate electrodes T9Gb in the second gate electrode T9G, and a line width of the first branch gate electrode T10Gb is less than a line width of the second branch gate electrode T9Gb, therefore, a length of the first channel of the present application can be less than a length of the second channel.

Furthermore, because when a width of the first active portion T10A along the second direction Y is over large, static electricity concentration would occur on the first active portion T10A to possibly damage the first active portion T10A by static electricity. Therefore, the present application can set the first active portion T10A as two separately disposed first sub-active portions T10Aa.

With reference to FIGS. 13 and 14, the second active layer 129 further comprises an active portion T1A of the second inverting transistor T1, an active portion T13A of the first cascade transistor T13, and an active portion T14A of the adjustment transistor T14. The active portions in the second inverting transistor T1, the first cascade transistor T13, and the adjustment transistor T14 are perpendicular to gate electrodes of corresponding transistors respectively, and overlap the gate electrodes of the corresponding transistors respectively. Overlapping portions thereof are channels of the active portions. Also, to improve a mobility of the metal oxide semiconductor transistor, in the signal generation module 10, a channel width of each of the active portions in the second inverting transistor T1, the first cascade transistor T13, and the adjustment transistor T14 is greater than a channel width of each of the active portions in the pull-up transistor T2, the first inverting transistor T3, the first feedback transistor T4, the second feedback transistor T5, the second filter transistor T8, the first filter transistor T11, and the second cascade transistor T12.

Figure 15:
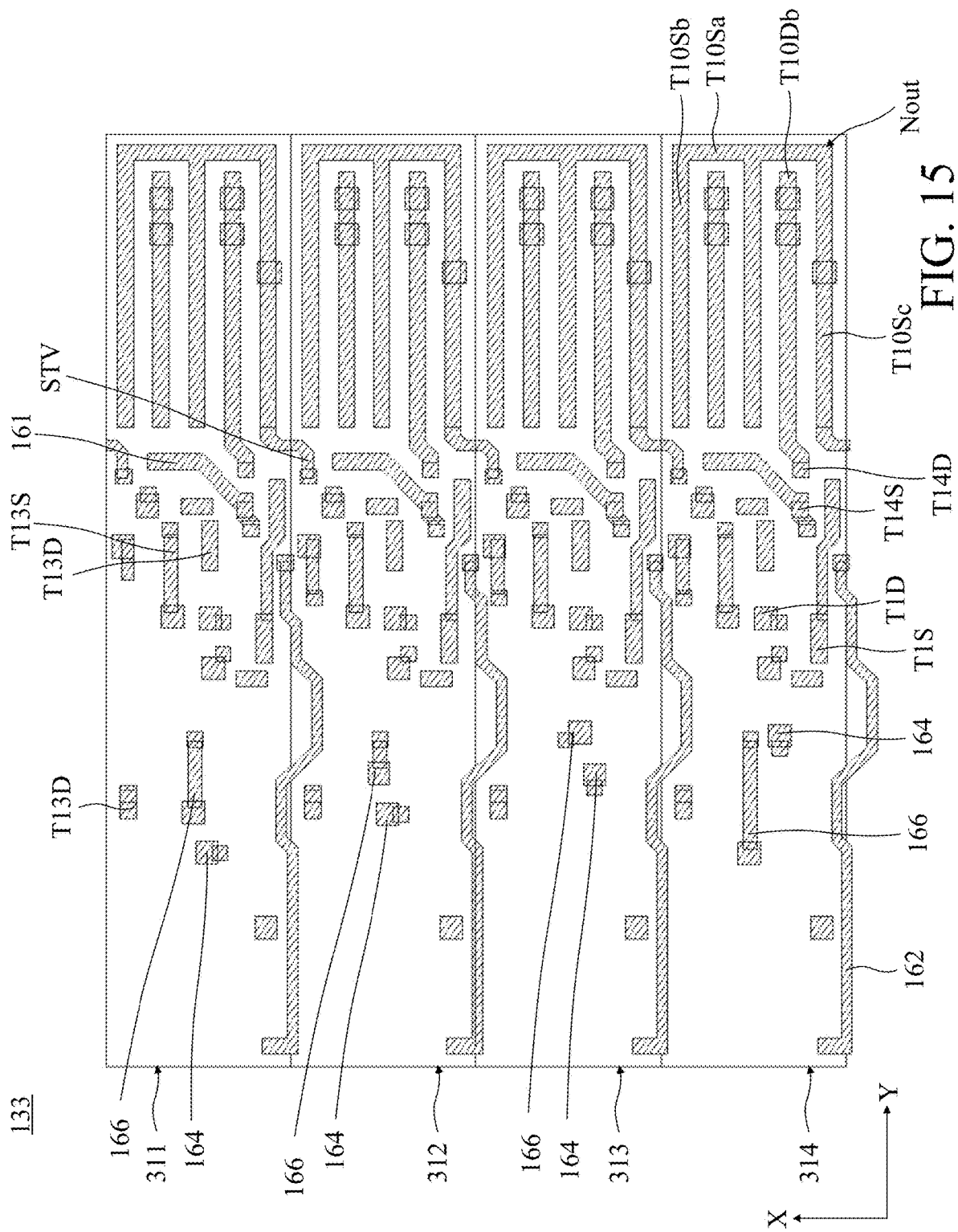
FIG. 15 is a film layer view of a first source and drain electrode layer in the display panel of the present application.

With reference to FIG. 15, FIG. 15 is a film layer view of the first source and drain electrode layer 133 in the display panel 100 of the present application.

In the present embodiment, the array driver layer 120 further comprises the first source and drain electrode layer 133 disposed on a side of the third gate electrode layer 131 away from the second gate electrode layer 127. The first source and drain electrode layer 133 comprises a first source electrode T10S and the first drain electrode T10D.

In the present embodiment, the first source electrode T10S comprises a first trunk source electrode T10Sa and a plurality of first branch source electrodes T10Sb disposed parallelly and spaced from one another. The first trunk source electrode T10Sa is located on a side of the first output module 20 near the display portion 200. The first drain electrode T10D comprises a plurality of first branch drain electrodes T10Db. The first trunk source electrode T10Sa extends along the first direction X. The first branch source electrodes T10Sb extend along the second direction Y. A side of the first branch source electrodes T10Sb away from the signal generation module 10 is connected to the first trunk source electrode T10Sa. The first branch drain electrodes T10Db extend along the second direction Y, and the first branch drain electrodes T10Db are disposed among the first branch source electrodes T10Sb.

In the present embodiment, along the top view direction of the display panel 100, two of the first branch source electrodes T10Sb on two sides of the first branch source electrodes T10Sb are disposed on two sides of the first gate electrode T10G respectively. At least one of the first branch source electrodes T10Sb and the first branch drain electrodes T10Db on an inside of the first branch source electrodes T10Sb are disposed among the first branch gate electrodes T10Gb. For example, in a structure of FIG. 15, the first source electrode T10S comprises one first trunk source electrode T10Sa and three first branch source electrodes T10Sb. The first drain electrode T10D comprises two first branch drain electrodes T10Db. The three first branch source electrodes T10Sb and the two first branch drain electrodes T10Db are arranged alternately along the first direction X. Namely, two first branch drain electrodes T10Db can be disposed between adjacent two of the first branch source electrodes T10Sb. Also, two of the first branch source electrodes T10Sb on an outermost side of three of the first branch source electrodes T10Sb are disposed on two sides of the first gate electrode T10G respectively. One first branch source electrode T10Sb and two first branch drain electrodes T10Db are disposed among the first branch gate electrodes T10Gb.

Figure 16:
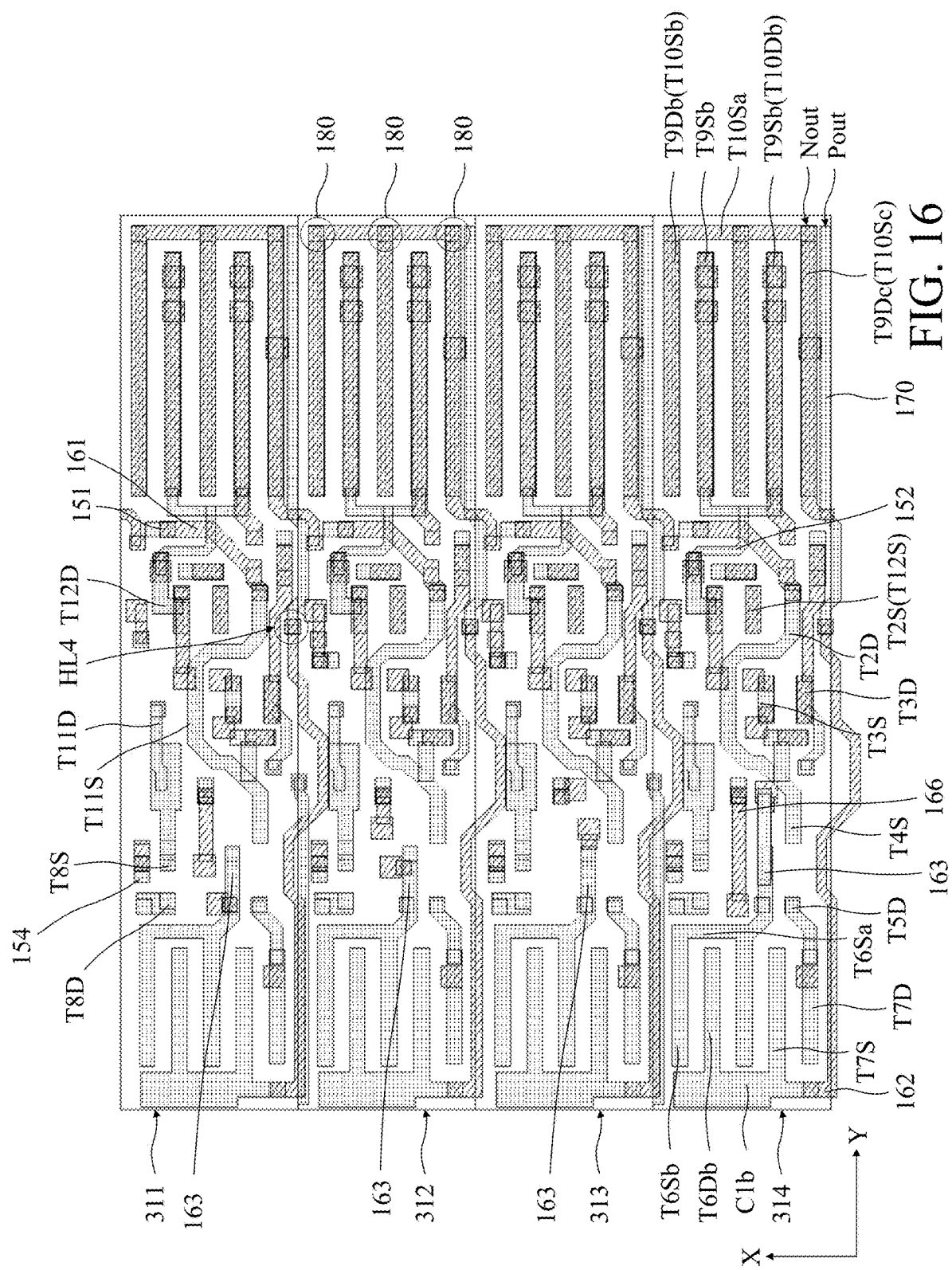
FIG. 16 is a stacked film layer view of the second gate electrode layer and the first source and drain electrode layer stacked in the display panel of the present application.
Figure 17:
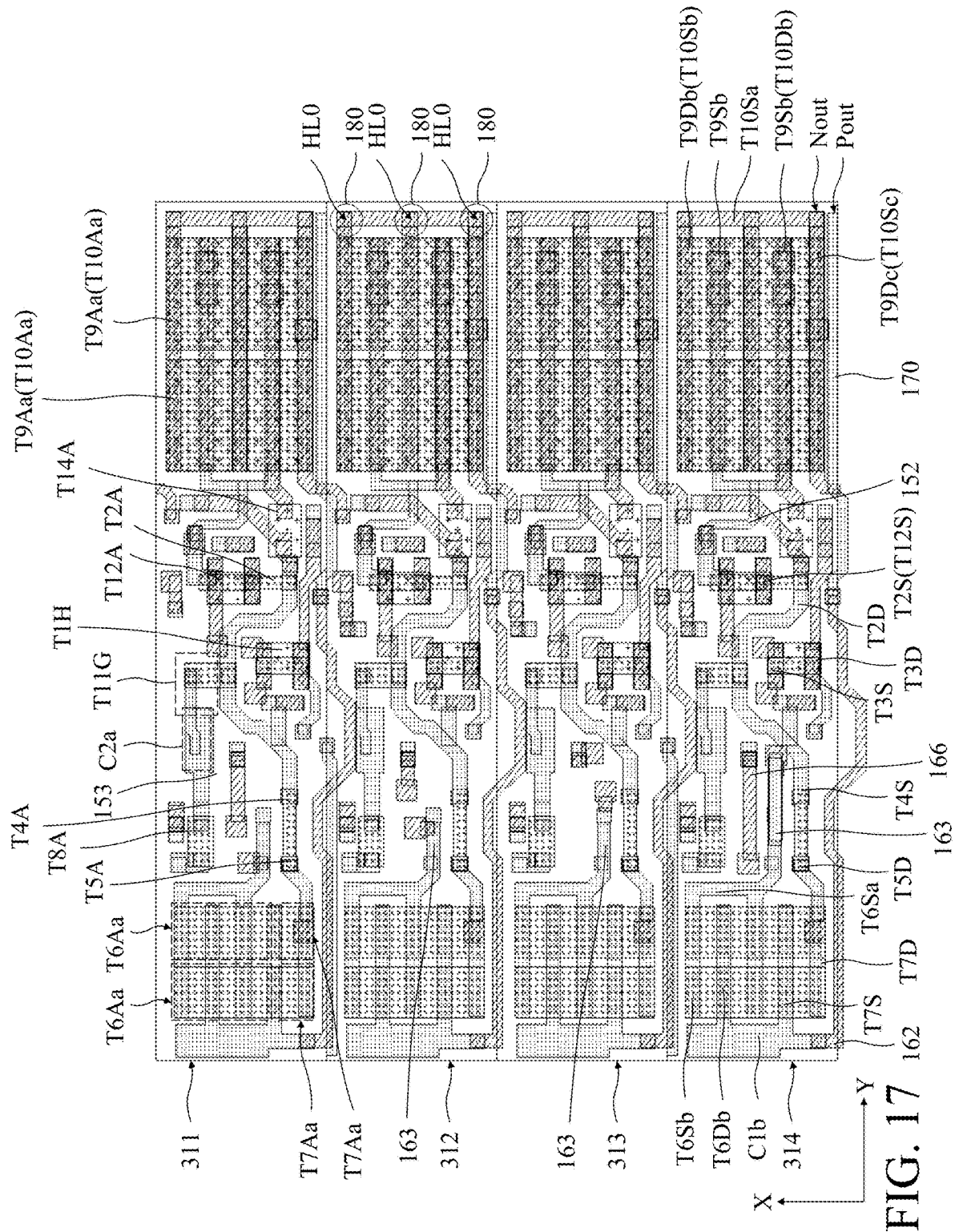
FIG. 17 is a stacked film layer view of the second gate electrode layer, the first active layer, the second active layer, and the first source and drain electrode layer stacked in the display panel of the present application.

With reference to FIG. 16, FIG. 16 is a stacked film layer view of the second gate electrode layer 127 and the first source and drain electrode layer 133 stacked in the display panel 100 of the present application. With reference to FIG. 17, FIG. 17 is a stacked film layer view of the second gate electrode layer 127, the first active layer 123, the second active layer 129, and the first source and drain electrode layer 133 stacked in the display panel 100 of the present application.

In the present embodiment, orthographic projections of the first branch source electrodes T10Sb on the second branch drain electrodes T9Db respectively coincide with the second branch drain electrodes T9Db respectively, and orthographic projections of the second branch source electrodes T9Sb on the first branch drain electrodes T10Db respectively coincide with the first branch drain electrodes T10Db respectively. Each of the first branch source electrodes T10Sb is electrically connected to one of the second branch drain electrodes T9Db through at least one connection hole. For example, three of the first branch source electrodes T10Sb coincide with three of the second branch drain electrodes T9Db respectively, and two of the second branch source electrodes T9Sb coincide with two of the first branch drain electrodes T10Db respectively.

In the present embodiment, lengths of the first branch source electrodes T10Sb and the second branch drain electrodes T9Db along the second direction Y can be equal. Lengths of the second branch source electrodes T9Sb and the first branch drain electrodes T10Db along the second direction Y can be equal.

In the present embodiment, the first branch source electrodes T10Sb and the first trunk source electrode T10Sa comprise a plurality of overlap portions 180. An orthographic projection of the connection hole HL0 on the first source electrode T10S is located within the overlap portions 180. For example, in FIG. 16, the first branch source electrodes T10Sb and the first trunk source electrode comprise three overlap portions 180. The three overlap portions 180 are electrically connected to the second branch drain electrodes T9Db of a lower layer respectively through corresponding connection holes HL0. The connection hole HL0 penetrates the first interlayer insulation layer 132, the fourth gate insulation layer 130, and the third gate insulation layer 128.

With reference to FIGS. 8, 16, and 17, the second gate electrode layer 127 further comprises a source electrode T2S and a drain electrode T2D of the pull-up transistor T2, a source electrode T3S and a drain electrode T3D of the first inverting transistor T3, a source electrode T4S and a drain electrode of the first feedback transistor T4, a source electrode and a drain electrode T5D of the second feedback transistor T5, a source electrode T8S and a drain electrode T8D of the second filter transistor T8, a source electrode T11S and a drain electrode T11D of the first filter transistor T11, and a source electrode T12S and a drain electrode T12D of the second cascade transistor T12. The source electrodes and drain electrodes of the above transistors are disposed on two sides of the active portion respectively.

With reference to FIGS. 15 to 17, the first source and drain electrode layer 133 further comprises a source electrode TIS and a drain electrode TID of the second inverting transistor T1, a source electrode T13S and a drain electrode T13D of the first cascade transistor T13, and a source electrode T14S and a drain electrode T14D of the adjustment transistor T14. The source electrode and the drain electrode of the above transistor are disposed on two sides of a corresponding active portion respectively.

Because the first gate electrode T10G of the first output transistor T10 is electrically connected to the second gate electrode T9G of the second output transistor T9, but the first gate electrode T10G is in the third gate electrode layer 131, the second gate electrode T9G is in the first gate electrode layer 125, therefore, to electrically connect the first gate electrode T10G and the second gate electrode T9G. The first output transistor T10 further comprises a first protrusion 191 connected to the first trunk gate electrode T10Ga. The first protrusion 191 extends toward a side near the signal generation module 10. The second output transistor T9 further comprises a second protrusion 192 connected to the second trunk gate electrode T9Ga. The second protrusion 192 extends toward a side near the signal generation module 10.

With reference to FIGS. 8, 16, and 17, the second gate electrode layer comprises a first connection section 151. The first connection section 151 is located between the drain electrode T12D and the second source electrode of the second cascade transistor T12. A first terminal of the first connection section 151 overlaps the second protrusion 192. A first terminal of the first connection section 151 can be electrically connected to the second protrusion 192 through a first via hole HL1. With reference to FIGS. 15 and 16, the first source and drain electrode layer comprises a first extension section 161. A first terminal of the first extension section 161 is electrically connected to the source electrode T14S of the adjustment transistor T14. A second terminal of the first extension section 161 is connected to a second terminal of the first connection section 151. Also, a region between the first terminal and the second terminal of the first extension section 161 overlaps the first protrusion 191. The second terminal of the first extension section 161 can be electrically connected to the second terminal of the first connection section 151 through a second via hole HL2. The region between the first terminal and the second terminal of the first extension section 161 can be electrically connected to the first protrusion 191 through a third via hole HL3.

In the present embodiment, the first via hole HL1 penetrates the second gate insulation layer 126. The second via hole HL2 penetrates the first interlayer insulation layer 132, the fourth gate insulation layer 130, and the third gate insulation layer 128. The third via hole HL3 penetrates the first interlayer insulation layer 132.

In the present embodiment, because the first gate electrode T10G is electrically connected to the second gate electrode T9G, and the first gate electrode T10G and the second gate electrode T9G are disposed between the first active portion T10A, when the first gate electrode T10G is turned on, the second gate electrode T9G is simultaneously turned on such that the first output transistor T10 becomes a dual gate transistor to improve a turn-on rate of the first output transistor T10.

In the display panel 100 of the present application, the first branch source electrode T10Sb comprises a first bottom portion electrode T10Sc near the driver unit 310 of a next level. The second branch drain electrodes T9Db comprises a second bottom portion electrode T9Dc near the driver unit 310 of the next level. Both the first bottom portion electrode T10Sc and the second bottom portion electrode T9Dc are electrically connected to the first signal output terminal Nout.

With reference to FIG. 15, the first source electrode T10S comprises three first branch source electrodes T10Sb, in the three first branch source electrodes T10Sb, the first branch source electrode T10Sb near the driver unit 310 of the next level is the first bottom portion electrode T10Sc. The second drain electrode T9D comprises three second branch drain electrodes T9Db, in the three second branch drain electrodes T9Db, the second branch drain electrode T9Db near the driver unit 310 of the next level is the second bottom portion electrode T9Dc. The first bottom portion electrode T10Sc is electrically connected to and overlaps the second bottom portion electrode T9Dc. Second, an end of the first bottom portion electrode T10Sc and/or the second bottom portion electrode T9Dc away from the signal generation module 10 is electrically connected to the first signal output terminal Nout to transmit a first gate electrode driving signal toward the display portion 200.

With reference to FIGS. 16 and 17, the first source and drain electrode layer further comprises a second extension section 162 extending along the second direction Y. A portion of the second extension section 162 is located in the driver unit 310 of a current level, another portion of the second extension section 162 is located in the driver unit 310 of a next level. With reference to FIG. 8, the second gate electrode layer 127 further comprises an output conductive line 170 extending along the second direction. The output conductive line 170 is disposed on a side of a second bottom portion electrode T9Sc in the second source electrode T9S away from the second branch drain electrodes T9Db. The second electrode plate C1b of the first storage capacitor C1 is electrically connected to a first terminal of the second extension section 162. A second terminal of the second extension section 162 is connected to a first terminal of the output conductive line 170 through a fourth via hole HL4. A second terminal of the output conductive line 170 is connected to the second signal output terminal Pout.

In the present embodiment, the fourth via hole HL4 penetrates the first interlayer insulation layer 132, the fourth gate insulation layer 130, the third gate insulation layer 128, and the second gate insulation layer 126. The second signal output terminal Pout is configured to output a second gate electrode driving signal.

With reference to FIGS. 16 and 17, the first source and drain electrode layer 133 further comprises the initial signal line STV. A first terminal of the initial signal line STV is connected to the first bottom portion electrode T10Sc in the driver unit 310 of a previous level. Also, in a structure of FIG. 10, the third gate electrode layer comprises a third connection section 153. The third connection section 153 extends from the driver units 310 of a $N^{th}$ level to the driver unit 310 of a $(N-1)^{th}$ level. A second terminal of the initial signal line STV is connected to a first terminal of the third connection section 153. A first gate electrode of the first cascade transistor T13 shares a gate electrode of the second cascade transistor T12, a portion of the third connection section 153 overlaps and is electrically connected to the first gate electrode of the first cascade transistor T13 and the gate electrode of the second cascade transistor T12. Also, an overlapping portion of the third connection section 153 serves as a second gate electrode of the first cascade transistor T13.

Second, the second gate electrode layer 127 further comprises a fourth connection section 154. A first terminal of the fourth connection section 154 is connected to the gate electrode of the second filter transistor T8, and a second terminal of the fourth connection section 154 is connected to a first terminal of the third connection section 153. A second terminal of the third connection section 153 is electrically connected to the initial signal line STV in the driver unit 310 of the $(N-1)^{th}$ level. Also, because a signal of the initial signal line STV in the driver unit 310 of the $(N-1)^{th}$ level comes from a first signal transmitting section in the driver unit 310 of the $(N-2)^{th}$ level, a signal of the gate electrode of the second filter transistor T8 of the present application comes from the first signal output terminal Nout of a $(N-2)^{th}$ level.

Figure 18:
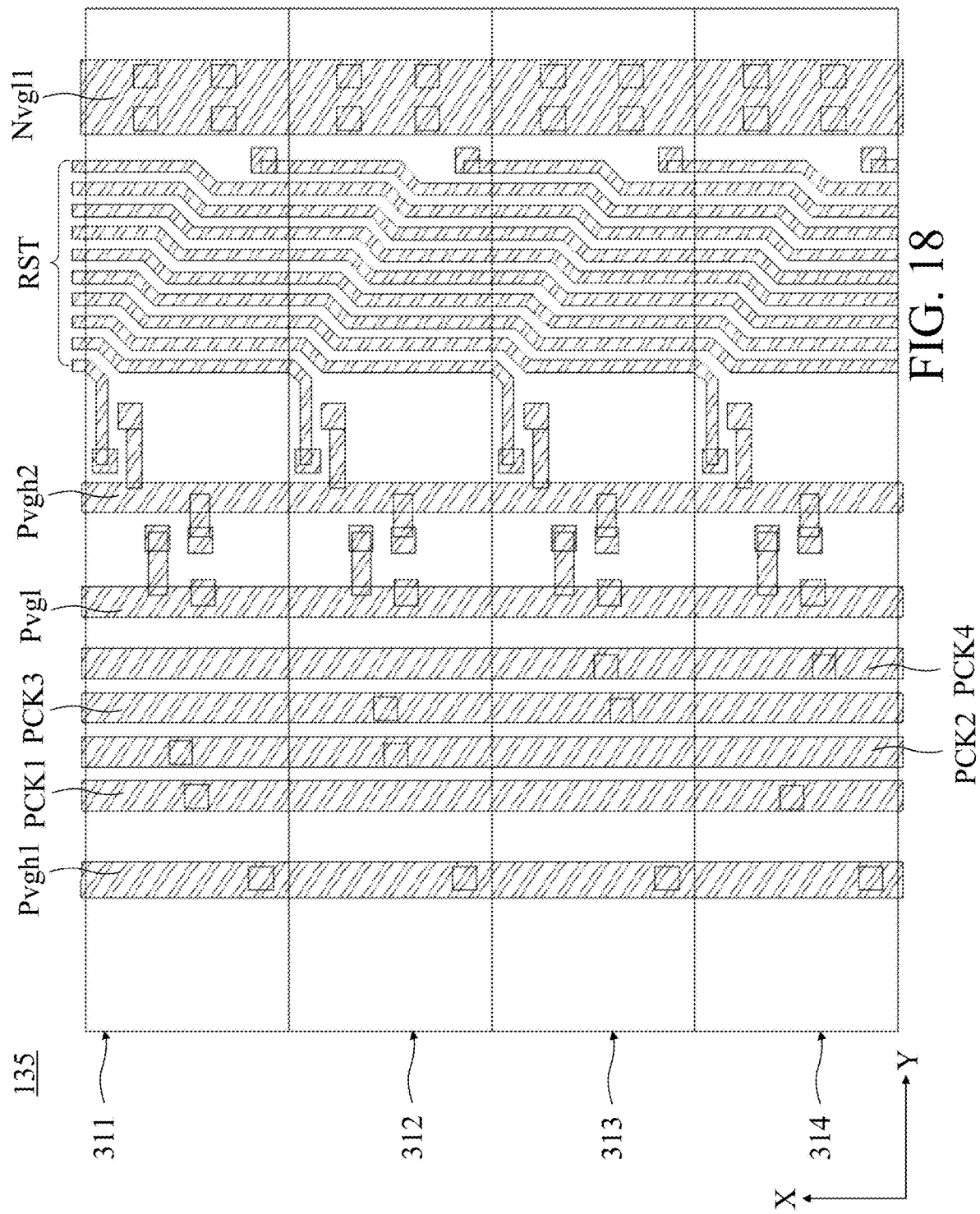
FIG. 18 is a film layer view of the second source and drain electrode layer in the display panel of the present application.
Figure 19:
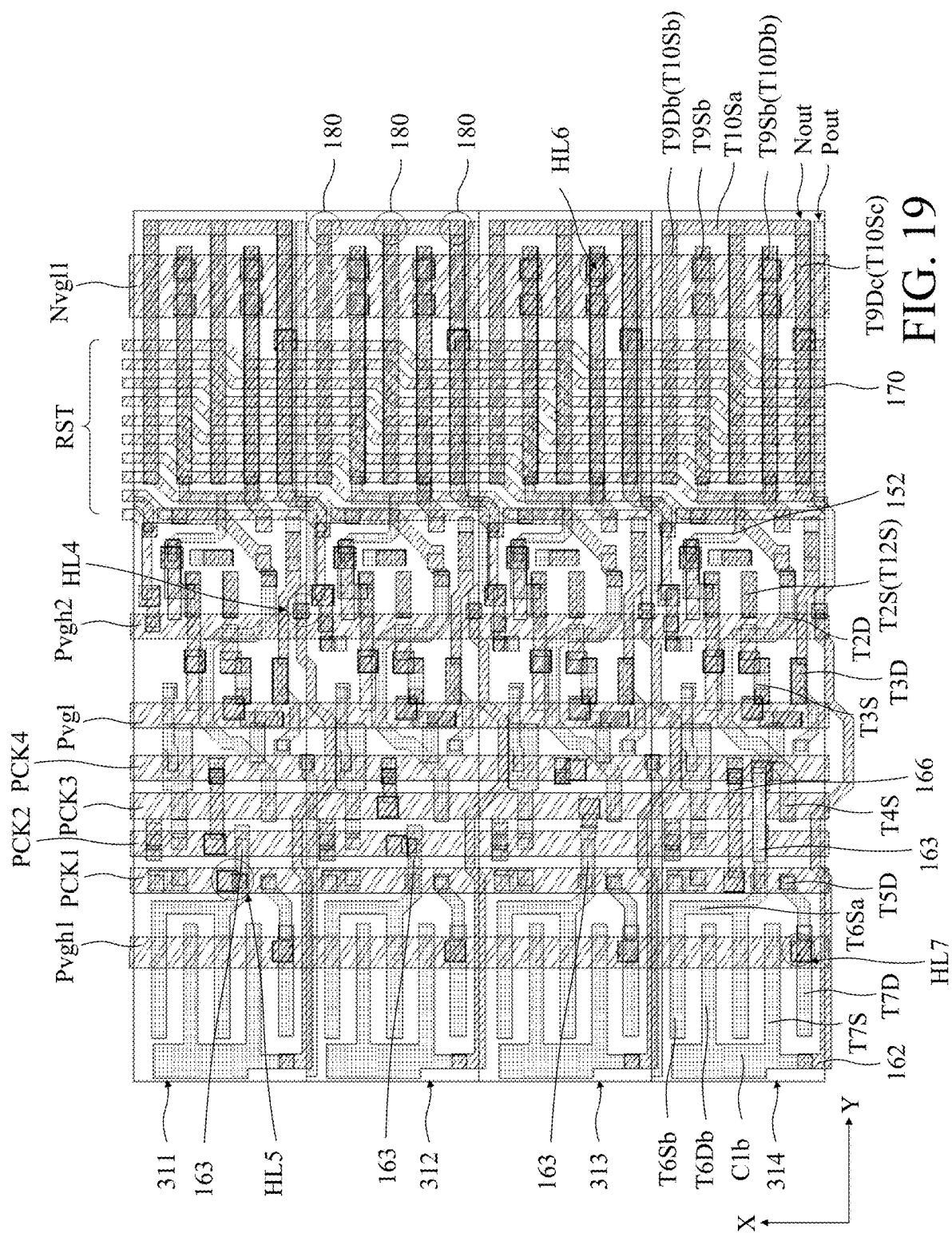
FIG. 19 is a film layer view of the second gate electrode layer, the first source and drain electrode layer, and the second source and drain electrode layer in the display panel of the present application.

With reference to FIG. 18, FIG. 18 is a film layer view of the second source and drain electrode layer 135 in the display panel 100 of the present application. With reference to FIG. 19, FIG. 19 is a film layer view of a second gate electrode layer 125, the first source and drain electrode layer 133, and the second source and drain electrode layer 135 in the display panel 100 of the present application.

In the present embodiment, the array driver layer 120 further comprises the second source and drain electrode layer 135 disposed on a side of the first source and drain electrode layer 133 away from the underlay substrate 110. The second source and drain electrode layer 135 comprises the first low potential line Nvgl1 and the first low potential line Nvgl1. The first branch source electrodes T10Sb in each of the driver units 310 overlaps the first branch drain electrodes T10Db. The first low potential line Nvgl1 is electrically connected to the first branch drain electrodes T10Db in each of the driver units 310 through a sixth via hole HL6. For example, the first low potential line Nvgl1 is electrically connected to two first branch drain electrodes T10Db in the driver unit 310 of each cascade. The first low potential line Nvgl1 is electrically connected to one first branch drain electrode T10Db through two sixth via holes HL6. The sixth via hole HL6 penetrates the second interlayer insulation layer 134. Also, because a drain electrode T14D of the adjustment transistor T14 is electrically connected to one first branch drain electrode T10Db, the drain electrode T14D of the adjustment transistor T14 also receives a low level signal of the first low potential line Nvgl1.

Figure 20:
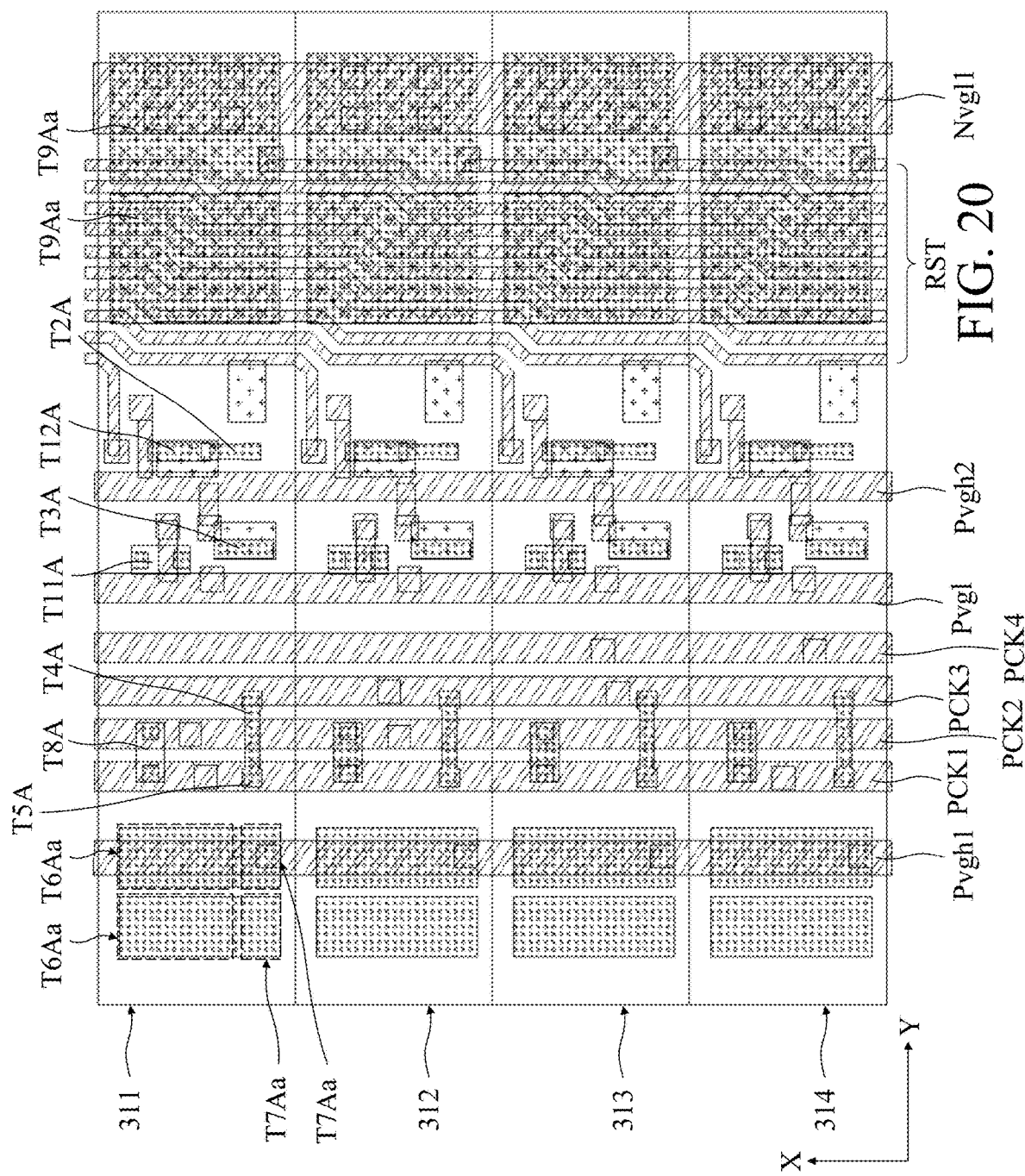
FIG. 20 is a stacked film layer view of the first active layer, the second active layer, and the second source and drain electrode layer stacked in the display panel of the present application.

With reference to FIG. 20, FIG. 20 is a stacked film layer view of the first active layer 123, the second active layer 129, and the second source and drain electrode layer 135 stacked in the display panel 100 of the present application.

In the present embodiment, the second source and drain electrode layer 135 further comprises the first high potential line Pvgh1. The first high potential line Pvgh1 and the first low potential line Nvgl1 are disposed oppositely and parallelly. The first high potential line Pvgh1 overlaps the third sub-active portions T6Aa and the fourth sub-active portions T7Aa near a side of the signal generation module 10, and the first high potential line Pvgh1 is electrically connected to the fourth drain electrode T7D through a seventh via hole HL.

In the present embodiment, along the second direction Y, a width of the first low potential line Nvgl1 is greater than a width of the first high potential line Pvgh1.

With reference to FIGS. 18 to 20, the second source and drain electrode layer 135 can further comprise the second low potential line Pvgl and the second high potential line Pvgh2 overlapping the signal generation module 10. The second low potential line Pvgl, the second high potential line Pvgh2, the first high potential line Pvgh1 are disposed parallelly and spaced from one another. The second low potential line Pvgl is disposed between the first high potential line Pvgh1 and the second high potential line Pvgh2. Widths of the second high potential line Pvgh2, the first high potential line Pvgh1, and the second low potential line Pvgl are equal.

In the present embodiment, because the second source electrode T9S of the second output transistor T9 is connected to a high level source, but the first low potential line Nvgl1 is disposed in a region in which the second output transistor T9 is located, the present application can transmit a signal of the first high potential line Pvgh1 to the second source electrode T9S. With reference to FIG. 8 specifically, the second gate electrode layer 127 further comprises a second connection section 152 disposed on a side of the second output transistor T9 near the signal generation module 10. A first terminal of the second connection section 152 is electrically connected to the second cascade transistor T12 the drain electrode T12D. A second terminal of the second connection section 152 is electrically connected to the second branch source electrodes T9Sb. Namely, the present application removes the original high potential line overlapping the second output transistor T9, and transmits a signal of the high potential line connected to the second cascade transistor T12 to the second output transistor T9, which reduces a space of the frame occupied by the gate electrode driver circuit 300 while guaranteeing no changes to the circuit structure, to achieve a design of a narrow frame of the display panel 100.

With reference to FIGS. 18 to 20, the second source and drain electrode layer 135 further comprises the first clock signal line CK and the second clock signal line XCK overlapping the signal generation module 10. The first clock signal line CK and the second clock signal line XCK are parallel to and spaced from the first high potential line Pvgh1. The first clock signal line CK and the second clock signal line XCK are disposed between the first high potential line Pvgh1 and the second low potential line Pvgl.

In the present embodiment, in the display panel 100 of the present application, the gate electrode driver circuit 300 comprises a plurality of repeat units, and each of the repeat units comprises at least four driver units 310. One repeat unit including four driver units 310 is used as an example as follows, the repeat units are arranged along the first direction X.

With reference to FIGS. 15 to 20, the repeat units can comprise a first GOA unit 311, a second GOA unit 312, a third GOA unit 313, and a fourth GOA unit 314 arranged sequentially along the first direction X. In the display panel 100 can comprise a first clock signal line PCK1, a second clock signal line PCK2, a third clock signal line PCK3, and a fourth clock signal line PCK4 arranged along the second direction Y, each two clock signal lines are connected to one of the driver units 310.

In the present embodiment, the first clock signal line PCK1 and the second clock signal line PCK2 are connected to the first GOA unit 311. The first clock signal line PCK1 is the first clock signal line CK of the first GOA unit 311. The second clock signal line PCK2 is the second clock signal line XCK of the first GO A unit 311. Namely, the first clock signal line PCK1 is connected to a gate electrode of the third output transistor T6 in the first GOA unit 311, and the second clock signal line PCK2 is connected to the gate electrode of the pull-up transistor T2 in the first GOA unit 311.

In the present embodiment, the second clock signal line PCK2 and the third clock signal line PCK3 are connected to the second GOA unit 312. The second clock signal line PCK2 is the first clock signal line CK of the first GOA unit 311. The third clock signal line PCK3 is the second clock signal line XCK of the first GOA unit 311. Namely, the second clock signal line PCK2 is connected to the gate electrode of the third output transistor T6 in the first GOA unit 311. The third clock signal line PCK3 is connected to the gate electrode of the pull-up transistor T2 in the first GOA unit 311.

In the present embodiment, the third clock signal line PCK3 and the fourth clock signal line PCK4 are connected to the third GOA unit 313. The third clock signal line PCK3 is the first clock signal line CK of the first GOA unit 311. The fourth clock signal line PCK4 is the second clock signal line XCK of the first GOA unit 311. Namely, the third clock signal line PCK3 is connected to the gate electrode of the third output transistor T6 in the first GOA unit 311. The fourth clock signal line PCK4 is connected to the gate electrode of the pull-up transistor T2 in the first GOA unit 311.

In the present embodiment, the fourth clock signal line PCK4 and the first clock signal line PCK1 are connected to the fourth GOA unit 314. The fourth clock signal line PCK4 is the first clock signal line CK of the first GOA unit 311. The first clock signal line PCK1 is the second clock signal line XCK of the first GOA unit 311. Namely, the fourth clock signal line PCK4 is connected to the gate electrode of the third output transistor T6 in the first GOA unit 311. The fourth clock signal line PCK4 is connected to the gate electrode of the pull-up transistor T2 in the first GOA unit 311.

With reference to FIGS. 15 to 20, the second gate electrode layer 127 in the driver unit 310 of each cascade further comprises a third extension section 163 connected to the third source electrode T6S. The third extension section 163 extends along the second direction Y, and the third extension section 163 is located within a region in which the signal generation module 10 is located. The first clock signal line CK in the driver unit 310 of each cascade is electrically connected to the third extension section 163 through a fifth via hole HL5.

In the present embodiment, because third output transistors T6 in the first GOA unit 311, the second GOA unit 312, the third GOA unit 313, and the fourth GOA unit 314 are connected to different clock signal lines, in the repeat unit, lengths of the third extension sections 163 in some of the driver units 310 along the second direction Y are different. Namely, the lengths of the third extension sections 163 in the first GOA unit 311, the second GOA unit 312, the third GOA unit 313, and the fourth GOA unit 314 are different. For example, the lengths of the third extension sections 163 in the first GOA unit 311, the second GOA unit 312, and the third GOA unit 313 are equal, and the length of the third extension section 163 in the fourth GOA unit 314 are longer than those of the other three.

In the present embodiment, in the driver unit 310, because the clock signal line is in the second source and drain electrode layer 135, the third extension section 163 is in the second gate electrode layer 127, and thus there are many interlayer spacing film layers, to prevent an over large depth of a via hole, the present application disposes a fourth extension section 164 on the first source and drain electrode layer 133 in each of the driver units 310. The second clock signal line PCK2 is electrically connected to the third extension section 163 through the fourth extension section 164.

With reference to FIG. 15, the first gate electrode layer 125 in the driver unit 310 of each cascade further comprises a fifth extension section 165 connected to the gate electrode of the pull-up transistor T2. The fifth extension section 165 extends along the second direction Y. Namely, the fifth extension section 165 mainly extends toward a side away from the first output module 20.

Also, with reference to FIGS. 15 and 16, the first source and drain electrode layer 133 in the driver unit 310 of each cascade further comprises a sixth extension section 166. The sixth extension section 166 extends along the second direction Y. A first terminal of the sixth extension section 166 is connected to the second clock signal line XCK in a corresponding one of the driver units 310. A second terminal of the sixth extension section 166 is connected to the fifth extension section 165.

In FIGS. 7, 15, and 16, lengths of the sixth extension sections 166 in the first GOA unit 311, the second GOA unit 312, and the third GOA unit 313 gradually decreases, the length of the sixth extension section 166 in the fourth GOA unit 314 increases comparatively in comparison to the length of the sixth extension section 166 in the third GOA unit 313. Also, lengths of the fifth extension sections 165 in the first GOA unit 311, the second GOA unit 312, and the third GOA unit 313 are equal to the length of the fifth extension section 165 in the fourth GOA unit 314 is longer than the length of the fifth extension section 165 in the third GOA unit 313.

In FIGS. 7, 15, and 16, because the pull-up transistors T2 in the first GOA unit 311, the second GOA unit 312, the third GOA unit 313, and the fourth GOA unit 314 are connected to different clock signal lines, in one repeat unit, a sum of lengths of the fifth extension section 165 and the sixth extension section 166 in a different driver unit 310 is different. For example, a sum of the lengths of the fifth extension section 165 and the sixth extension section 166 in each of the first GOA unit 311, the second GOA unit 312, and the third GOA unit 313 gradually decreases, the sum of the lengths of the fifth extension section 165 and the sixth extension section 166 in the fourth GOA unit 314 is greater than the sum of the lengths of the fifth extension section 165 and the sixth extension section 166 in the first GOA unit 311.

With reference to FIGS. 18 and 19, the second source and drain electrode layer 135 comprises the reset signal lines RST spaced at intervals. The reset signal lines RST overlap the first buffer unit 210, and the reset signal lines RST are disposed between the first low potential line Nvgl1 and the second high potential line Pvgh2. First terminals of the reset signal lines RST are connected to the first branch drain electrodes T10Db in the driver units 310 of a $(N-10)^{th}$ level. Second terminals of the reset signal lines RST are connected to gate electrodes of the first filter transistors T11.

It should be explained that the source electrode and the drain electrode of the above transistor of the present application are only different in naming, and one of the source electrode and the drain electrode is an input terminal and the other is an output terminal.

It should be explained that figures of the film layer structures provided by the present application are not only suitable for the circuit structures in FIGS. 3 and 5, but also are suitable for the present application as long as it has the same module structures as in the present application, namely, it has module structures for outputting two types of gate electrode driving signals Nout, Pout.

The present application also provides a display terminal, and the display terminal comprises the above display panel. The display terminal can be any product or component with display functionality, including cell phones, tablets, televisions, monitors, laptops, digital photo frames, navigation devices, and more.

The present application provides a display panel. The display panel comprises a display portion and a gate electrode driver circuit located on a side of the display portion. The gate electrode driver circuit comprises a quantity N of GOA units cascaded. The quantity N of the GOA units are arranged along a first direction. Each of the GOA units comprises a signal generation module, a first output module, and a second output module disposed along a second direction. The first output module is disposed on a side of the signal generation module near the display portion. The first output module is configured to output a first gate electrode driving signal. The second output module is disposed on a side of the signal generation module away from the display portion. The second output module is configured to output a second gate electrode driving signal. The first gate electrode driving signal is different from the second gate electrode driving signal. Along the second direction, lengths of the first output module and the second output module are different. The second direction is parallel to scan lines of the display panel. The first direction is perpendicular to the second direction. The present application disposes two output modules, with different length and configured different gate electrode driving signals, on two sides of the signal generation module such that the two output modules have sufficient widths along the first direction, which guarantees performance of transistors in the two output modules and prevents a technical issue of an increased width of a frame resulting from the two output modules stacked on the same side, and achieves a design of a narrow frame.

In the above-mentioned embodiments, the descriptions of the various embodiments are focused. For the details of the embodiments not described, reference may be made to the related descriptions of the other embodiments.

The display panel provided by the embodiment of the present application is described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments or equivalently replace some of the technical features. These modifications or replacements do not make the essence of the technical solutions depart from a range of the technical solutions of the embodiments of the present application.

What is claimed is:

1. A display panel, comprising a display portion and a gate electrode driver circuit located on a side of the display portion, wherein the gate electrode driver circuit comprises a quantity N of driver units that are cascaded, the quantity N of the driver units are arranged along a first direction, and each of the driver units comprises a signal generation module, a first output module, and a second output module disposed along a second direction;

wherein the first output module is disposed on a side of the signal generation module near the display portion, and the first output module is configured to output a first gate electrode driving signal;

wherein the second output module is disposed on a side of the signal generation module away from the display portion, the second output module is configured to output a second gate electrode driving signal, and the first gate electrode driving signal is different from the second gate electrode driving signal;

wherein the first output module comprises a first buffer unit and a second buffer unit, the first buffer unit and the second buffer unit are stacked along a third direction, the third direction is perpendicular to a plane in which the first direction and the second direction are located, the second direction is parallel to scan lines of the display panel, an included angle between the first direction and the second direction is greater than 0° and is less than or equal to 90°, and the N is a positive integer;

wherein the first buffer unit comprises a first active portion, the second buffer unit comprises a second active portion, the first active portion is a metal oxide semiconductor, the second active portion is a silicon-containing semiconductor; and wherein the first buffer unit is disposed near a light exiting side of the display panel, and the second buffer unit is disposed away from the light exiting side of the display panel.

2. The display panel according to claim 1, wherein
the first buffer unit comprises a first output transistor comprising the first active portion, and the second buffer unit comprises a second output transistor comprising the second active portion; and
along the second direction, a length of the first output transistor is equal to a length of the second output transistor.

3. The display panel according to claim 2, wherein
the first active portion comprises a first channel, and the second active portion comprises a second channel; and
a length of the first active portion is equal to a length of the second active portion, and a length of the first channel is less than a length of the second channel.

4. The display panel according to claim 2, wherein
the first output transistor further comprises a first gate electrode disposed on the first active portion, the second output transistor further comprises a second gate electrode disposed on the second active portion;
the first gate electrode comprises a first trunk gate electrode and a plurality of first branch gate electrodes connected to the first trunk gate electrode, the second gate electrode comprises a second trunk gate electrode and a plurality of second branch gate electrodes connected to the second trunk gate electrode, the first trunk gate electrode and the second trunk gate electrode extend along the first direction, and the first branch gate electrodes and the second branch gate electrodes extend along the second direction; and
an orthographic projection of the first trunk gate electrode on the second trunk gate electrode coincides with the second trunk gate electrode, orthographic projections of the first branch gate electrodes on the second branch gate electrodes are located within the second branch gate electrodes respectively.

5. The display panel according to claim 4, wherein along the second direction, a length of the first branch gate electrode is equal to a length of the second branch gate electrode;
and along the first direction, a width of the first branch gate electrode is less than a width of the second branch gate electrode.

6. The display panel according to claim 4, wherein
the first output transistor further comprises a first source electrode and a first drain electrode disposed on a side of the first gate electrode away from the first active portion, the second output transistor further comprises a second source electrode and a second drain electrode disposed between the second gate electrode and the first active portion;
the first source electrode comprises a first trunk source electrode and a plurality of first branch source electrodes connected to the first trunk source electrode, the first drain electrode comprises a plurality of first branch drain electrodes that are disposed and spaced from one another, the second source electrode comprises a plurality of second branch source electrodes that are disposed and spaced from one another, the second drain electrode comprises a plurality of second branch drain electrodes that are disposed and spaced from one another, the first trunk source electrode extends along the first direction, and the first branch source electrodes, the first branch drain electrodes, the second branch source electrodes, and the second branch drain electrodes extend along the second direction; and
the first branch source electrodes and the first branch drain electrodes are disposed alternately along the first direction, the second branch source electrodes and the second branch drain electrodes along the first direction are disposed alternately, orthographic projections of the first branch source electrodes on the second branch drain electrodes respectively coincide with the second branch drain electrodes respectively, orthographic projections of the second branch source electrodes on the first branch drain electrodes respectively coincide with the first branch drain electrodes respectively, each of the first branch source electrodes is electrically connected to one of the second branch drain electrodes through at least one connection hole.

7. The display panel according to claim 6, wherein
the first trunk source electrode is located on a side of the first output module near the display portion; and
the first branch source electrode and the first trunk source electrode include a plurality of overlap portions, and orthographic projections of the connection holes on the first source electrode are located within the overlap portions respectively.

8. The display panel according to claim 6, wherein the display panel further comprises a first high potential line and a first low potential line disposed on the first source electrode or the first drain electrode, the first high potential line is electrically connected to the first branch drain electrodes, and the first low potential line is electrically connected to the second branch source electrodes.

9. The display panel according to claim 1, wherein
the first gate electrode driving signal is a positive pulse signal, and the second gate electrode driving signal is a negative pulse signal; and
in a time interval of a frame, the first signal output terminal outputs two positive pulse signals, and the second signal output terminal outputs one negative pulse signal.

10. A display panel, comprising a display portion and a gate electrode driver circuit located on a side of the display portion, wherein the gate electrode driver circuit comprises a quantity N of driver units that are cascaded, the quantity N of the driver units are arranged along a first direction, and each of the driver units comprises a signal generation module, a first output module, and a second output module disposed along a second direction;
wherein the first output module is disposed on a side of the signal generation module near the display portion, and the first output module is configured to output a first gate electrode driving signal;
wherein the second output module is disposed on a side of the signal generation module away from the display portion, the second output module is configured to output a second gate electrode driving signal, and the first gate electrode driving signal is different from the second gate electrode driving signal;
wherein the first output module comprises a first buffer unit and a second buffer unit, the first buffer unit and the second buffer unit are stacked along a third direction, the third direction is perpendicular to a plane in which the first direction and the second direction are located, the second direction is parallel to scan lines of the display panel, and the Nis a positive integer;
wherein the first buffer unit comprises a first active portion, the second buffer unit comprises a second active portion, and material of the first active portion is different from material of the second active portion;
wherein the first active portion is a metal oxide semiconductor, the second active portion is a silicon-containing semiconductor; and wherein the first buffer unit is disposed near a light exiting side of the display panel, and the second buffer unit is disposed away from the light exiting side of the display panel.

11. The display panel according to claim 10, wherein
the first buffer unit comprises a first output transistor comprising the first active portion, and the second buffer unit comprises a second output transistor comprising the second active portion; and
along the second direction, a length of the first output transistor is equal to a length of the second output transistor.

12. The display panel according to claim 11, wherein
the first active portion comprises a first channel, and the second active portion comprises a second channel; and
a length of the first active portion is equal to a length of the second active portion, and a length of the first channel is less than a length of the second channel.

13. The display panel according to claim 11, wherein
the first output transistor further comprises a first gate electrode disposed on the first active portion, the second output transistor further comprises a second gate electrode disposed on the second active portion;
the first gate electrode comprises a first trunk gate electrode and a plurality of first branch gate electrodes connected to the first trunk gate electrode, the second gate electrode comprises a second trunk gate electrode and a plurality of second branch gate electrodes connected to the second trunk gate electrode, the first trunk gate electrode and the second trunk gate electrode extend along the first direction, and the first branch gate electrodes and the second branch gate electrodes extend along the second direction; and
an orthographic projection of the first trunk gate electrode on the second trunk gate electrode coincides with the second trunk gate electrode, orthographic projections of the first branch gate electrodes on the second branch gate electrodes are located within the second branch gate electrodes respectively.

14. The display panel according to claim 13, wherein along the second direction, a length of the first branch gate electrode is equal to a length of the second branch gate electrode; and along the first direction, a width of the first branch gate electrode is less than a width of the second branch gate electrode.

15. The display panel according to claim 13, wherein
the first output transistor further comprises a first source electrode and a first drain electrode disposed on a side of the first gate electrode away from the first active portion, the second output transistor further comprises a second source electrode and a second drain electrode disposed between the second gate electrode and the first active portion;
the first source electrode comprises a first trunk source electrode and a plurality of first branch source electrodes connected to the first trunk source electrode, the first drain electrode comprises a plurality of first branch drain electrodes that are disposed and spaced from one another, the second source electrode comprises a plurality of second branch source electrodes that are disposed and spaced from one another, the second drain electrode comprises a plurality of second branch drain electrodes that are disposed and spaced from one another, the first trunk source electrode extends along the first direction, and the first branch source electrodes, the first branch drain electrodes, the second branch source electrodes, and the second branch drain electrodes extend along the second direction; and
the first branch source electrodes and the first branch drain electrodes are disposed alternately along the first direction, the second branch source electrodes and the second branch drain electrodes along the first direction are disposed alternately, orthographic projections of the first branch source electrodes on the second branch drain electrodes respectively coincide with the second branch drain electrodes respectively, orthographic projections of the second branch source electrodes on the first branch drain electrodes respectively coincide with the first branch drain electrodes respectively, each of the first branch source electrodes is electrically connected to one of the second branch drain electrodes through at least one connection hole.

16. The display panel according to claim 15, wherein
the first trunk source electrode is located on a side of the first output module near the display portion; and
the first branch source electrode and the first trunk source electrode include a plurality of overlap portions, and orthographic projections of the connection holes on the first source electrode are located within the overlap portions respectively.

17. The display panel according to claim 15, wherein the display panel further comprises a first high potential line and a first low potential line disposed on the first source electrode or the first drain electrode, the first high potential line is electrically connected to the first branch drain electrodes, and the first low potential line is electrically connected to the second branch source electrodes.

18. The display panel according to claim 10, wherein
the first gate electrode driving signal is a positive pulse signal, and the second gate electrode driving signal is a negative pulse signal; and
in a time interval of a frame, the first signal output terminal outputs two positive pulse signals, and the second signal output terminal outputs one negative pulse signal.

* * * * *